United States Patent
Nomura et al.

(10) Patent No.: US 8,904,955 B2
(45) Date of Patent: Dec. 9, 2014

(54) SUBSTRATE PROCESSING APPARATUS

(75) Inventors: Makoto Nomura, Toyama (JP); Yukio Ozaki, Tateyama-machi (JP); Reizo Nunozawa, Toyama (JP); Satoru Takahata, Imizu (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 1007 days.

(21) Appl. No.: 12/389,431

(22) Filed: Feb. 20, 2009

(65) Prior Publication Data

US 2009/0229634 A1  Sep. 17, 2009

(30) Foreign Application Priority Data

Feb. 26, 2008  (JP) ................. 2008-044220

(51) Int. Cl.
*C23C 16/00* (2006.01)
*H01L 21/67* (2006.01)

(52) U.S. Cl.
CPC .................. *H01L 21/67276* (2013.01)
USPC ........................................... 118/702

(58) Field of Classification Search
USPC .......................... 156/345.26, 345.24; 118/702
See application file for complete search history.

(56) References Cited

U.S. PATENT DOCUMENTS

| | | | |
|---|---|---|---|
| 5,925,212 A * | 7/1999 | Rice et al. ................ | 156/345.27 |
| 6,210,481 B1 | 4/2001 | Sakai et al. | |
| 6,287,390 B2 | 9/2001 | Sakai et al. | |
| 2001/0004878 A1 | 6/2001 | Sakai et al. | |
| 2005/0233477 A1* | 10/2005 | Yamazaki et al. ................ | 438/5 |

FOREIGN PATENT DOCUMENTS

| | | |
|---|---|---|
| JP | 11329955 | 11/1999 |
| JP | 2000-58532 | 2/2000 |
| JP | 3902082 | 1/2007 |
| JP | 2007266261 | 10/2007 |

* cited by examiner

*Primary Examiner* — Maureen Gramaglia
(74) *Attorney, Agent, or Firm* — Brundidge & Stanger, P.C.

(57) ABSTRACT

A substrate processing apparatus includes a control unit executing a first recipe for substrate processing. After the substrate processing is completed through the execution of the first recipe, if a predetermined time is elapsed in a state that a next substrate to be processed is not carried into the process chamber, a second recipe is executed for maintaining a process chamber where the substrate is processed.

15 Claims, 14 Drawing Sheets

SUBSTRATE PROCESSING APPARATUS

CROSS-REFERENCE TO RELATED PATENT APPLICATION

This U.S. non-provisional patent application claims priority under 35 U.S.C. §119 of Japanese Patent Application No. 2008-044220, filed on Feb. 26, 2008, and Japanese Patent Application No. 2009-006904, filed on Jan. 15, 2009, in the Japanese Patent Office, the entire contents of which are hereby incorporated by reference.

BACKGROUND OF THE INVENTION

1. Field of the Invention

The present invention relates to a substrate processing apparatus for processing substrates such as a semiconductor substrate and a glass substrate.

2. Description of the Prior Art

Conventionally, when a substrate as a processing target is not present in a substrate processing apparatus (for example, after a substrate processing is completed), a process chamber remains in a non-operational state. After a next substrate to be processed is loaded into the substrate processing apparatus, the substrate is heat-treated if necessary.

However, if an interval between production processes increases, a temperature inside of the process chamber decreases excessively, which causes a difference between the initial processing result of a processed substrate and the processing result of a successively processed substrate. Furthermore, organic materials attached to the inside of a process chamber or a boat installed in a transfer chamber, leading to the quality degradation.

SUMMARY OF THE INVENTION

To solve the above problems, the present invention provides a substrate processing apparatus which can prevent the non-uniformity in the substrate processing results, regardless of a non-operational time between predetermined production processes (lot processes or batch processes).

According to a feature of the present invention, there is provided a substrate processing apparatus, including: a boat including a plurality of holding members and configured to hold a plurality of substrates horizontally; a process chamber accommodating the boat when the plurality of substrates are processed; a control unit executing a first recipe for processing the plurality of substrates and a second recipe for maintaining the process chamber by performing a boat loading step, a purge cleaning step and a boat unloading step; wherein the control unit: starts a watch timer operation when the plurality of substrates are completely processed by executing the first recipe; executes the second recipe when a predetermined time elapses after starting the watch timer operation in a state wherein a next substrate to be processed is not loaded into the boat; restarts the watch timer operation when the second recipe is completed; and starts a next production processing according to an instruction of next production processing by executing the first recipe after the second recipe is completed without starting the watch timer operation when the control unit receives the instruction of next processing while executing the second recipe starts the next production processing according to the instruction of next production processing by executing the first recipe when the control unit receives the instruction of next production processing during the watch timer operation after the second recipe is completed, and executes the second recipe by performing each step of a boat loading step, a purge cleaning step and a boat unloading step in a state wherein the plurality of substrates is not loaded in the boat.

According to another feature of the present invention, there is provided a method of manufacturing a semiconductor device in the substrate processing apparatus, wherein if start of a first recipe is instructed during execution of a second recipe for maintaining a process chamber where a substrate is processed, a next substrate is processed by executing the first recipe after the execution of the second recipe.

According to another feature of the present invention, there is provided a method of managing a semiconductor manufacturing apparatus, comprising: (a) executing a first recipe to process a substrate; and (b) executing a second recipe to prepare for the processing of the substrate, wherein in the operation (b), time elapsed from the completion of the operation (a) is measured until a next substrate processing is started, and the second recipe is controlled to be executed, based on the measured elapsed time, to maintain a process chamber where the substrate is processed.

DETAILED DESCRIPTION OF THE PREFERRED EMBODIMENTS

First, explanation will be given on a substrate processing apparatus in accordance with a first embodiment of the present invention.

Figure 1:
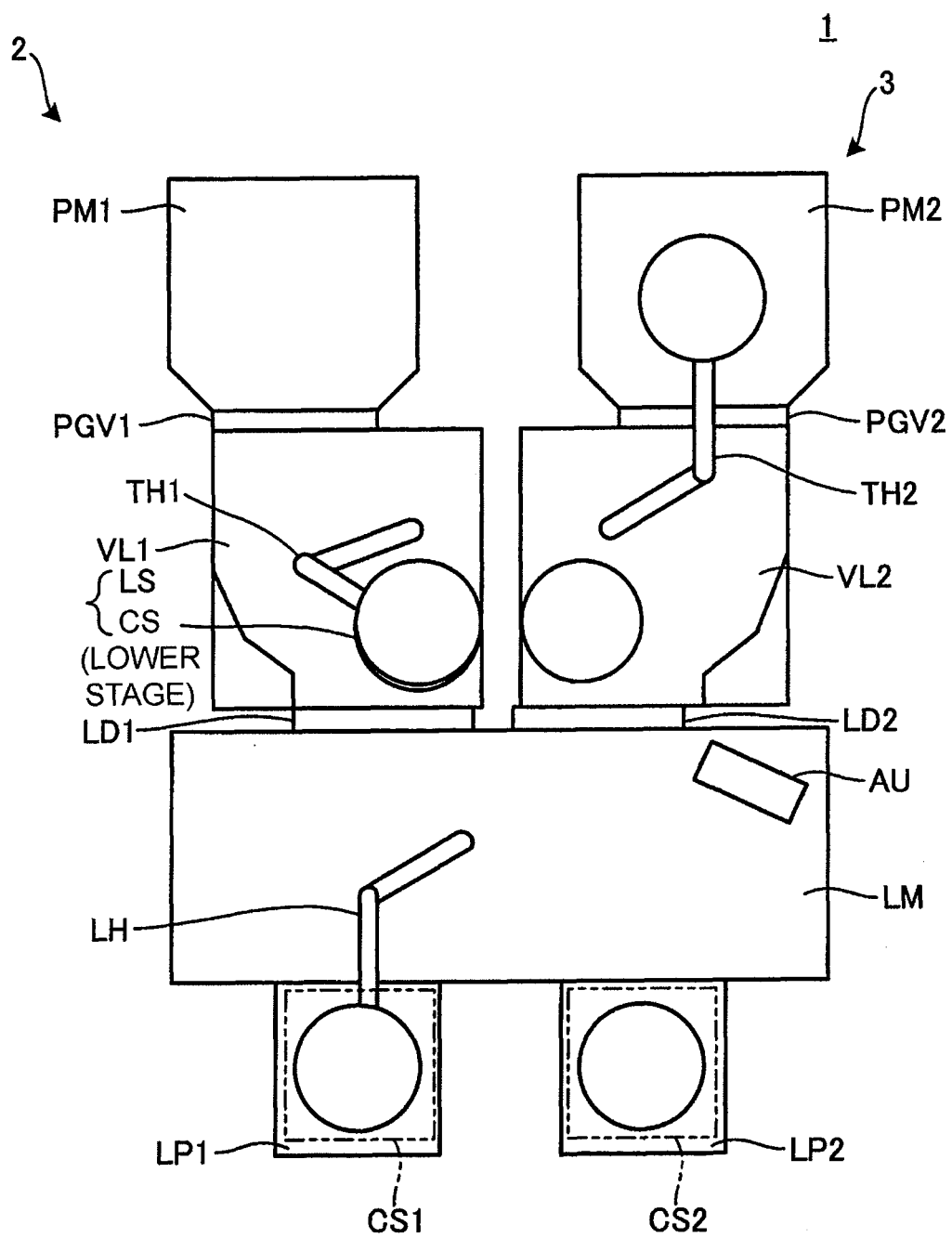
FIG. 1 is a schematic view showing an in-line type semiconductor manufacturing apparatus in accordance with a first embodiment of the present invention.

FIG. 1 is a schematic view showing an in-line type semiconductor manufacturing apparatus 1 as an example of a substrate processing apparatus in accordance with an embodiment of the present invention. In the construction of FIG. 1, a plurality of process chambers or wafer carrying robots and load lock chambers for transferring a carrier are connected with each other in parallel lengthy constructions. Additionally, the semiconductor manufacturing apparatus 1 uses a carrier for carrying a substrate (wafer).

In FIG. 1, the in-line type semiconductor manufacturing apparatus 1 is configured in two channels, and fundamentally is configured by a plurality of modules (a first processing module 2 and a second processing module 3) having the following functions. The first processing module 2 has a process chamber PM1 and a vacuum lock chamber VL1, and the second processing module 3 has a process chamber PM2 and a vacuum lock chamber VL2. In the semiconductor manufacturing apparatus 1, gate valves PGV1 and PGV2 are installed between the process chambers PM1 and PM2 and the vacuum lock chambers VL1 and VL2, respectively, and multistage slots are included in the vacuum lock chambers VL1 and VL2, respectively. The multistage slots include buffer slots LS over the vacuum robot handlers TH1 and TH2 and cooling stages CS under the vacuum robot handlers TH1 and TH2, respectively. In an air loader LM, an aligner AU and a loader handler LH are mounted. Between the vacuum lock chambers VL1 and VL2 and the air loader LM, loader doors LD1 and LD2 are installed, respectively.

The functions of each module will be described in more detail. The process chambers PM1 and PM2 have the functions of executing a predetermined processing on a wafer by a chemical processing reaction such as chemical vapor deposition (CVD) and providing an added value to the wafer. Moreover, the process chambers PM1 and PM2 have the functions adapted to each film-forming method, such as gas introduction or exhaust, temperature control in a furnace, and plasma discharge processing.

The vacuum lock chambers VL1 and VL2 may control the pressure inside the chamber to vacuum/atmospheric pressure, and include robots for carrying a wafer into/out of the process chambers PM1 and PM2. In addition, the vacuum lock chambers VL1 and VL2 include multistage slots capable of holding wafers therein. For example, a two-stage slot includes a buffer slot LS for holding a wafer in an upper stage and a cooling stage CS for cooling a wafer in a lower stage.

The air loader LM includes a robot capable of carrying a wafer into/out of each load lock chamber (that is, the vacuum lock chambers VL1 and VL2). In addition, the air loader LM includes the aligner AU for correcting slippage of the carried wafers to align notches of the wafers (the notches are formed in the outer peripheral edge of the wafers for prealignment purposes in order to determine the wafer direction) in a certain direction. Furthermore, the air loader LM includes the loader handler LH for carrying the wafer between the air loader LM and load ports LP1 and LP2.

The load ports LP1 and LP2 as an introduction port are capable of transferring (introducing) cassettes CS1 and CS2 as a carrier charged with the wafer (the carrier is capable of holding a plurality of wafers) between the semiconductor manufacturing apparatus 1 and the outside. In addition, a carrier ID on the face of the cassettes CS1 and CS2 may be configured to be read/written in the load ports LP1 and LP2.

In the construction of the semiconductor manufacturing apparatus 1 as shown in FIG. 1, one process chamber PM1 and one vacuum lock chamber VL1 are set as one pair, and the other process chamber PM2 and the other vacuum lock chamber VL2 are set as another pair, and each pair is connected to the air loader LM. The semiconductor manufacturing apparatus 1 of FIG. 1 is configured with two lines, but may be configured with more lines.

Figure 2:
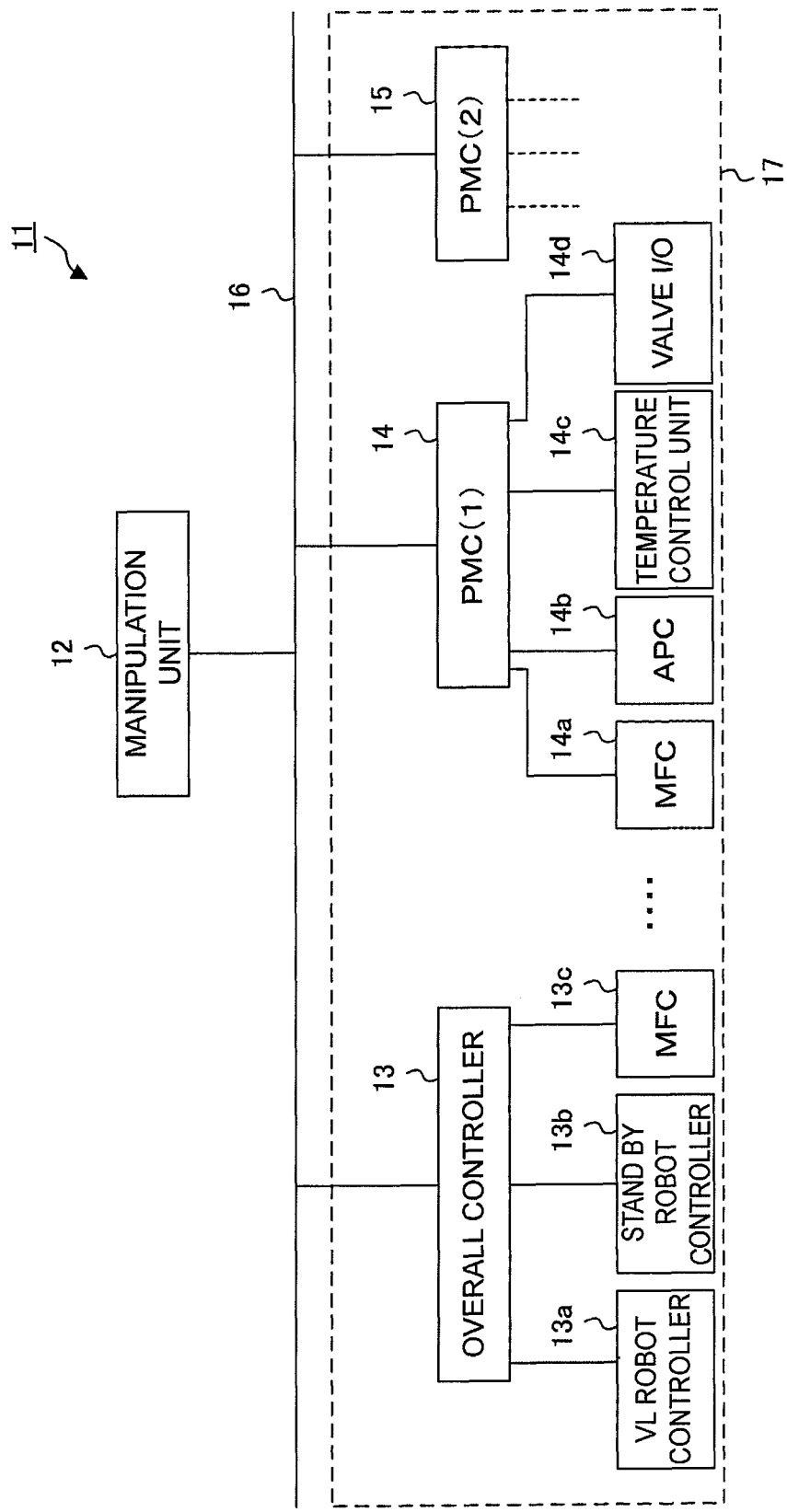
FIG. 2 is a block diagram showing a construction of a controller for controlling the semiconductor manufacturing apparatus 1.

In addition, a controller (described later with reference to FIG. 2) is connected to the semiconductor manufacturing apparatus 1 shown in FIG. 2. The controller includes units for performing a carrying control or a process control.

FIG. 2 is a block diagram showing the construction of a controller for controlling the semiconductor manufacturing apparatus 1 shown in FIG. 1.

In FIG. 2, a controller (control unit) 11 includes a manipulation unit 12, an overall controller 13, a PMC(1) 14, and a PMC(2) 15 that are connected to each other via a LAN cable 16. A VL robot controller 13a, an air robot controller 13b, and an MFC 13c are connected to the overall controller 13. An MFC 14a, an APC 14b, a temperature controller 14c, and a valve I/O 14d are connected to the PMC(1) 14. Here, the MFC 14a is a mass flow controller for controlling a flow rate of gas, and the APC 14b is an auto pressure controller for controlling a pressure in the process chamber PM. The temperature controller 14c performs a temperature control in the process chamber, and the valve I/O 14d is an input/output port for controlling ON/OFF of a valve for exhaust or gas. The PMC (2) 15 has the same construction as that of the PMC(1) 14.

The manipulation unit 12 includes a display unit and a memory unit. The display unit displays instruction of system control commands, monitor display, logging data, alarm interpretation, parameter edition or the like on a screen. The memory unit stores a variety of recipes (production processing recipe (first recipe) for processing a substrate, maintenance recipe (second recipe) for maintaining the process chamber or the like) or instruction data inputted by a predetermined input unit through a screen (manipulation screen) provided in the display unit. The overall controller 13 controls an overall operation of a system, the VL robot controller 13a, the air robot controller 13b, and an exhaust system such as the MFC 13c, valves, or pumps.

Next, explanation will be given on an exemplary operation of the controller 11 shown in FIG. 2. The overall controller 13 receives an operation start instruction (lot processing request to be described later) from the manipulation unit 12 and then instructs the air robot controller 13b to carry a wafer. After the corresponding wafer is carried into the buffer slot LS of the vacuum lock chamber VL from the carrier, an exhaust control (that is, control of pumps or valves) of the vacuum lock chamber VL is performed.

When the vacuum lock chamber VL reaches a predetermined negative pressure, the wafer is carried into the corresponding PMC (that is, the PMC(1) 14 or the PMC(2) 15) and an execution of the production processing recipe is instructed in order to provide an added value to the wafer. Each of the overall controller 13, the PMC(1) 14, and the PMC(2) 15 has a memory (temporary memory unit), and recipes or parameters are downloaded to the memory before the instruction of the operation start. A variety of parameters or recipes may be stored in an external memory unit (not shown).

Next, explanation will be given on the timing of execution of a maintenance recipe for maintaining the atmosphere in the process chambers PM1 and PM2 during an apparatus standby (waiting for a lot start) in the semiconductor manufacturing apparatus 1.

Figure 3:
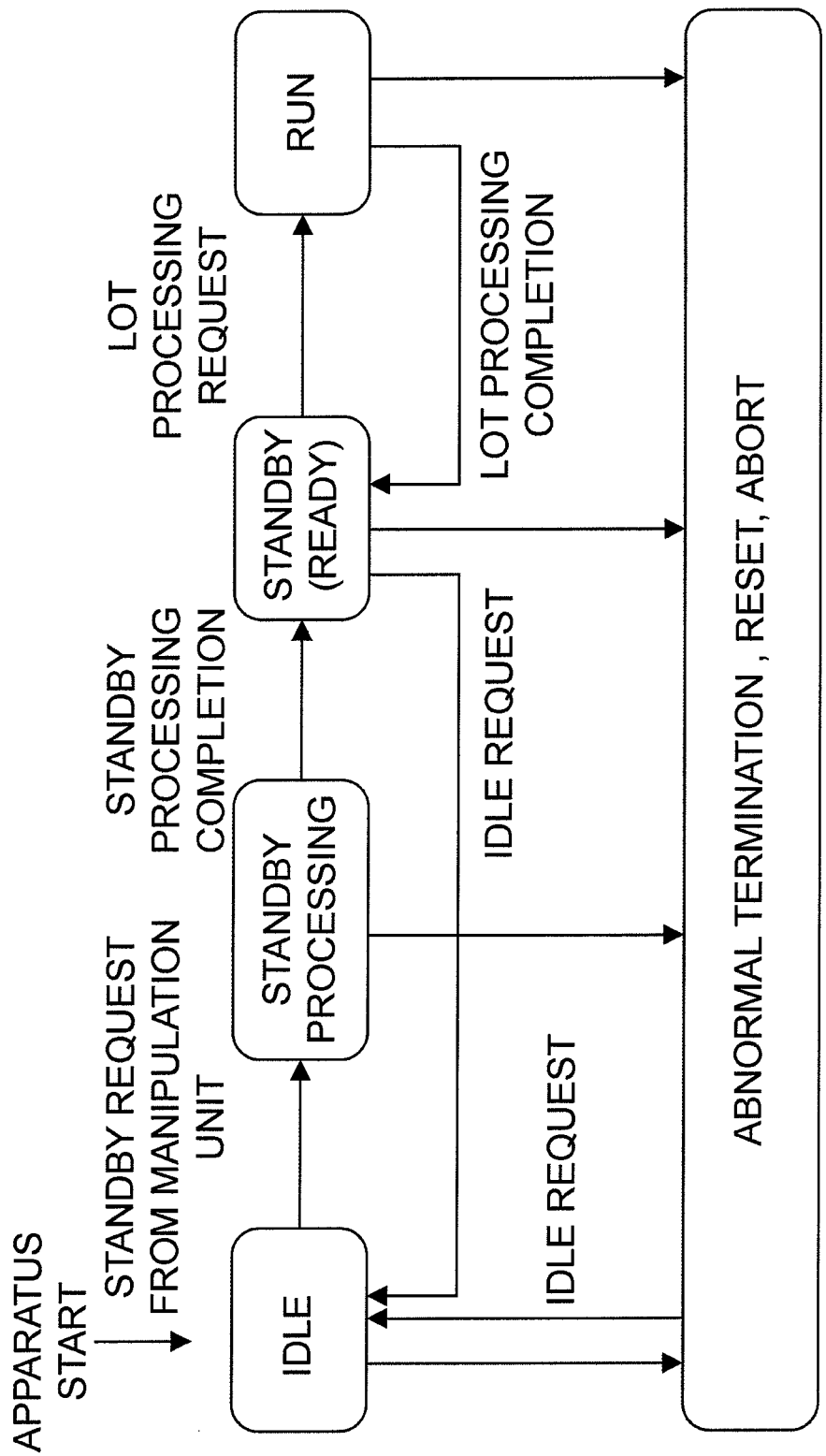
FIG. 3 is a view showing the state transition of the semiconductor manufacturing apparatus 1.

FIG. 3 is a view showing the state transition of the semiconductor manufacturing apparatus 1.

As shown in FIG. 3, the semiconductor manufacturing apparatus 1 transits an idle state, a standby processing state, a standby state, a run state, and an abnormal end state. The idle state is a waiting state. For example, in the idle state, it is possible to receive a material cassette or select a recipe. The standby processing state is a state of arranging an environment which makes it possible to start executing the selected production processing recipe. The standby processing state is also referred to as a standby state. The standby (ready) state is a state where the currently selected production processing recipe is ready for executing start (run). The run state is a state where the currently selected production processing recipe is being executed. The abnormal end state is a state except for the above states, that is, a transition state for the case of abnormal ends such as reset and abort.

When the semiconductor manufacturing apparatus 1 starts, it becomes an idle state. In the idle state, the semiconductor manufacturing apparatus 1 receives a standby request from the manipulation unit 12, and transits to a standby processing state. In the standby processing state, when the standby processing is completed, the semiconductor manufacturing apparatus 1 transits to a standby (ready) state. In the standby (ready) state, when the semiconductor manufacturing apparatus 1 receives an idle request from the manipulation unit 12, it returns to the idle state. Also, in the standby (ready) state, when the semiconductor manufacturing apparatus 1 receives a lot processing (production processing) request from the manipulation unit 12, it becomes a run state to perform the substrate processing. In the run state, when the lot processing is completed, the semiconductor manufacturing apparatus 1 returns to the standby (ready) state.

In at least a few states of the idle state, the standby processing state, the standby (ready) state, and the run state, when abnormal end occurs, the semiconductor manufacturing apparatus 1 transits to the abnormal end state. In the abnormal end state, when the semiconductor manufacturing apparatus 1 receives an idle request from the manipulation unit 12, it transits to the idle state.

The maintenance recipe is executed in the standby (ready) state.

Next, explanation will be given specifically on the timing of execution of the maintenance recipe in the standby (ready) state.

Figure 4:
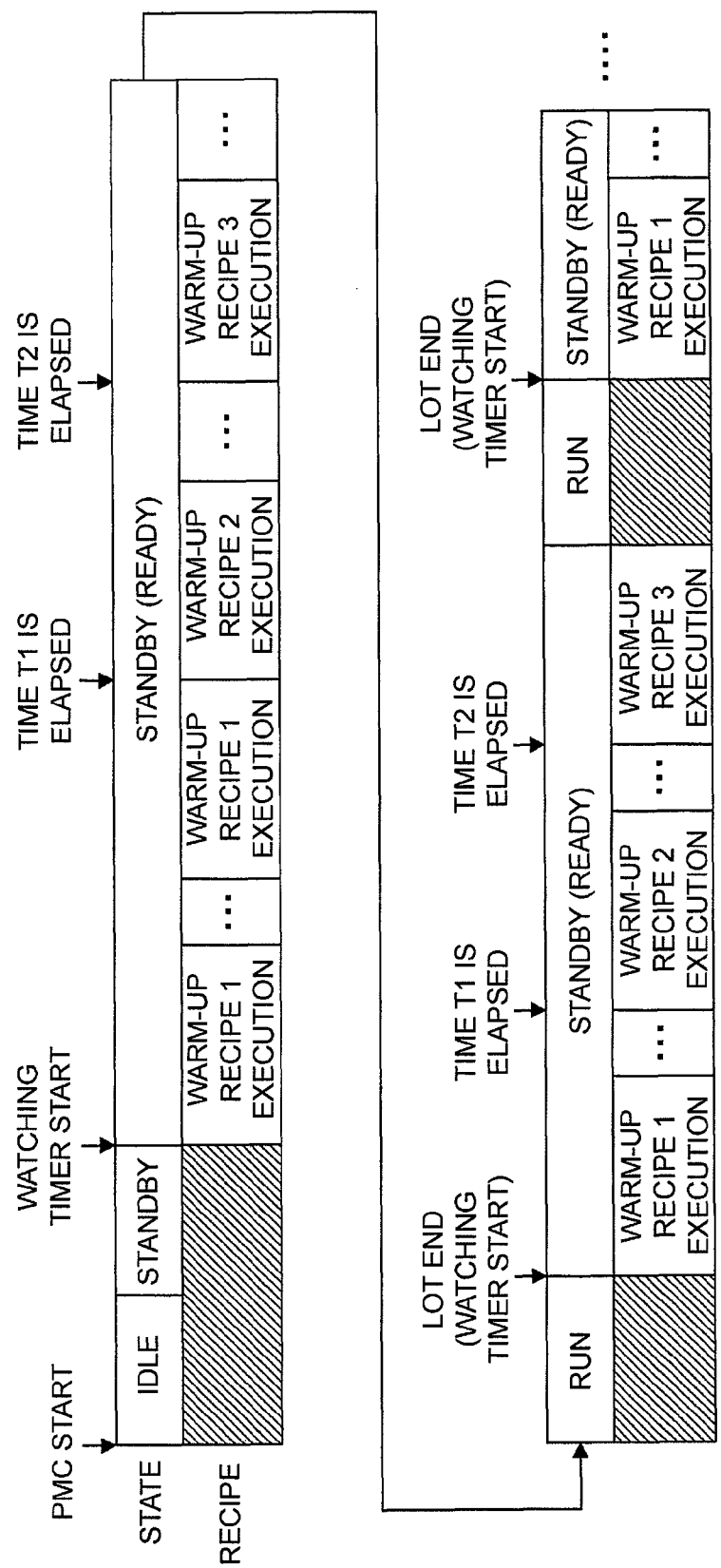
FIG. 4 is a view showing the relationship of the state of the semiconductor manufacturing apparatus 1 and the operation of a maintenance recipe executed based on the elapsed time after the completion of the substrate processing.

FIG. 4 is a view showing the relationship of the state of the semiconductor manufacturing apparatus 1 and the operation of a maintenance recipe executed based on the elapsed time after the completion of the substrate processing. In FIG. 4, only the operation of the maintenance recipe is shown, and the operation of the production processing recipe is not shown. Also, in FIG. 4, executions of a warm-up recipe 1, a warm-up recipe 2, and a warm-up recipe 3 are shown as the maintenance recipe by way of example but the number of maintenance recipes is not limited thereto.

As shown in FIG. 4, when the PMC(1) 14 and the PMC(2) 15 (hereinafter, referred to as PMC(1) 14 or the like) start, the semiconductor manufacturing apparatus 1 transits to the idle state and then receives a standby request to transit to the standby state. When the standby processing is normally completed, the overall controller 13 instructs the PMC(1) 14 or the like to start a warm-up recipe. The PMC(1) 14 or the like receives the corresponding instruction to start operating a watch timer and execute repeatedly the warm-up recipe 1 as the maintenance recipe.

When time T1 is elapsed after the standby processing is normally completed, the PMC(1) 14 or the like completes the warm-up recipe 1 and executes repeatedly the warm-up recipe 2 as the maintenance recipe.

Time T1 and time T2 is watched by the PMC(12) or the like. Here, if time T1 or time T2 is elapsed without the instruction of the overall controller 13, the PMC(1) 14 or the like executes the warm-up recipe 1 to the warm-up recipe 3.

When time T2 is elapsed after the standby processing is normally completed, the PMC(1) 14 or the like completes the warm-up recipe 2 and executes repeatedly the warm-up recipe 3 as the maintenance recipe.

For example, T1 is 60 minutes and T2 is 120 minutes. That is, the warm-up recipe 1 is executed repeatedly for 60 minutes after transition to the standby (ready) state, the warm-up recipe 2 is executed repeatedly for next 60 minutes after the elapsed time T1, and the warm-up recipe 3 is executed repeatedly after the elapsed time T2.

The overall controller 13 receives a lot processing request from the manipulation unit 12 and instructs the PMC(1) 14 or the like to stop executing the maintenance recipe. The PMC (1) 14 or the like receives the stop instruction to stop executing the maintenance recipe. Also, if the PMC(1) 14 or the like receives the stop instruction while executing the maintenance recipe, it executes the maintenance recipe without stopping it halfway until the completion.

The overall controller 13 instructs stop of the maintenance recipe, and then instructs start of the production processing recipe. The PMC(1) 14 or the like receives the start instruction to start execution of the production processing recipe. As such, the semiconductor manufacturing apparatus 1 transits from the standby (ready) state to the run state. When the lot processing is completed, the semiconductor manufacturing apparatus 1 transits from the run state to the standby (ready) state, and the overall controller 13 instructs start of the maintenance recipe. The PMC(1) 14 or the like receives the start instruction to start operating the watch timer. As such, after the substrate processing executed based on the production processing recipe and before the next substrate processing of the corresponding substrate, the controller 11 instructs the execution of the maintenance recipe based on time elapsed since the corresponding substrate processing is completed.

The maintenance recipe, in the standby (ready) state, is executed based on the timing different from the above-described timing.

Figure 5:
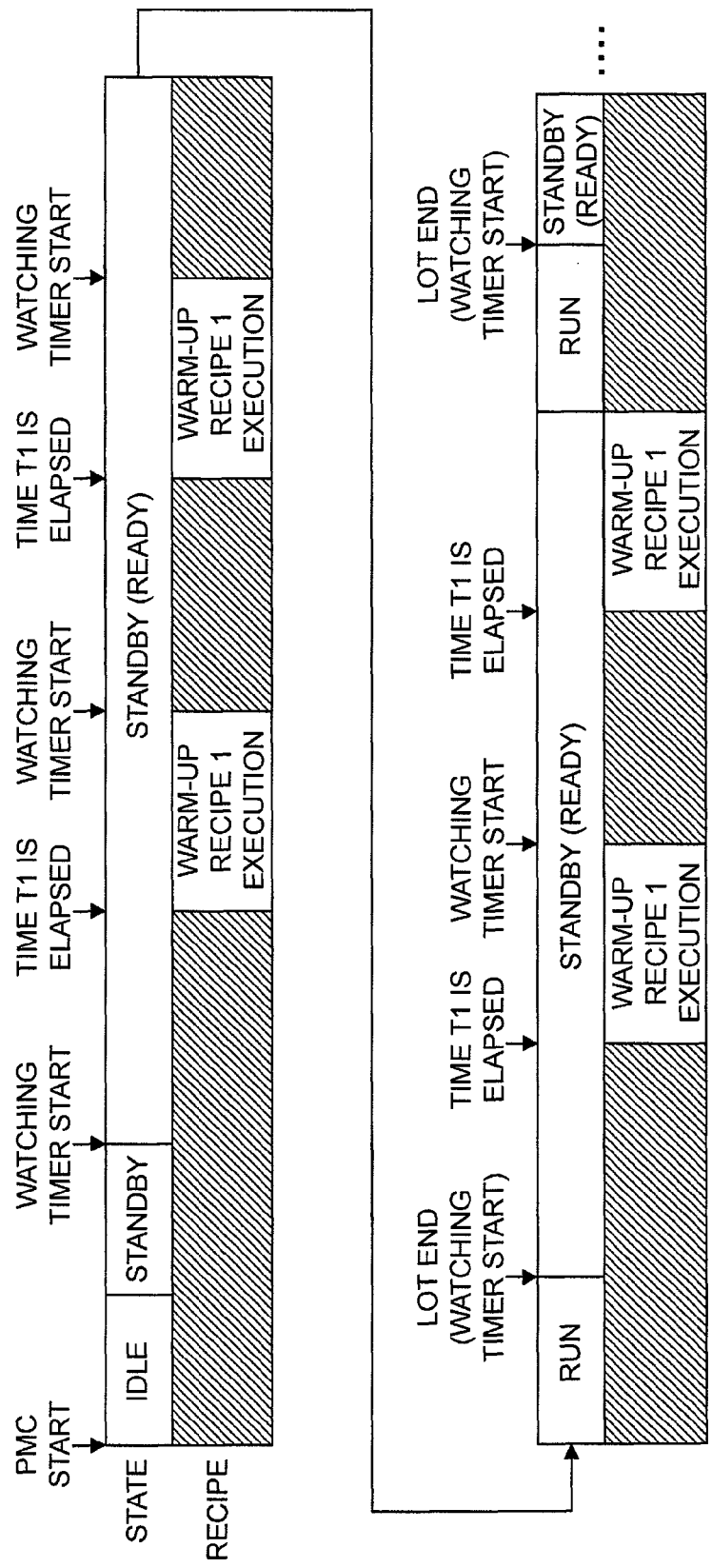
FIG. 5 is a view showing the relationship of the state of the semiconductor manufacturing apparatus 1 and the operation of a maintenance recipe executed based on the timing different from that of FIG. 4.

FIG. 5 is a view showing the relationship of the state of the semiconductor manufacturing apparatus 1 and the operation of a maintenance recipe executed based on the timing different from that of FIG. 4. In FIG. 5, only the operation of the maintenance recipe is shown, and the operation of the production processing recipe is not shown. Also, in FIG. 5, the execution of the warm-up recipe 1 is shown as the maintenance recipe by way of example.

As shown in FIG. 5, in the standby (ready) state, the maintenance recipe is executed repeatedly at predetermined intervals. In more detail, when the semiconductor manufacturing apparatus 1 transits from the standby state or the run state to the standby (ready) state, the overall controller 13 instructs start of the warm-up recipe 1. The PMC(1) 14 or the like receives the start instruction to start operating the watch timer. When time T1 is elapsed after the operation of the watch timer starts, the PMC(1) 14 and the PMC(2) 15 execute the warm-up recipe 1 as the maintenance recipe. When the execution of the warm-up recipe 1 is completed, the PMC(1) 14 or the like restarts operation of the watch timer.

The above-described operation of the maintenance recipe may be set by using the manipulation unit 12.

Figure 6:
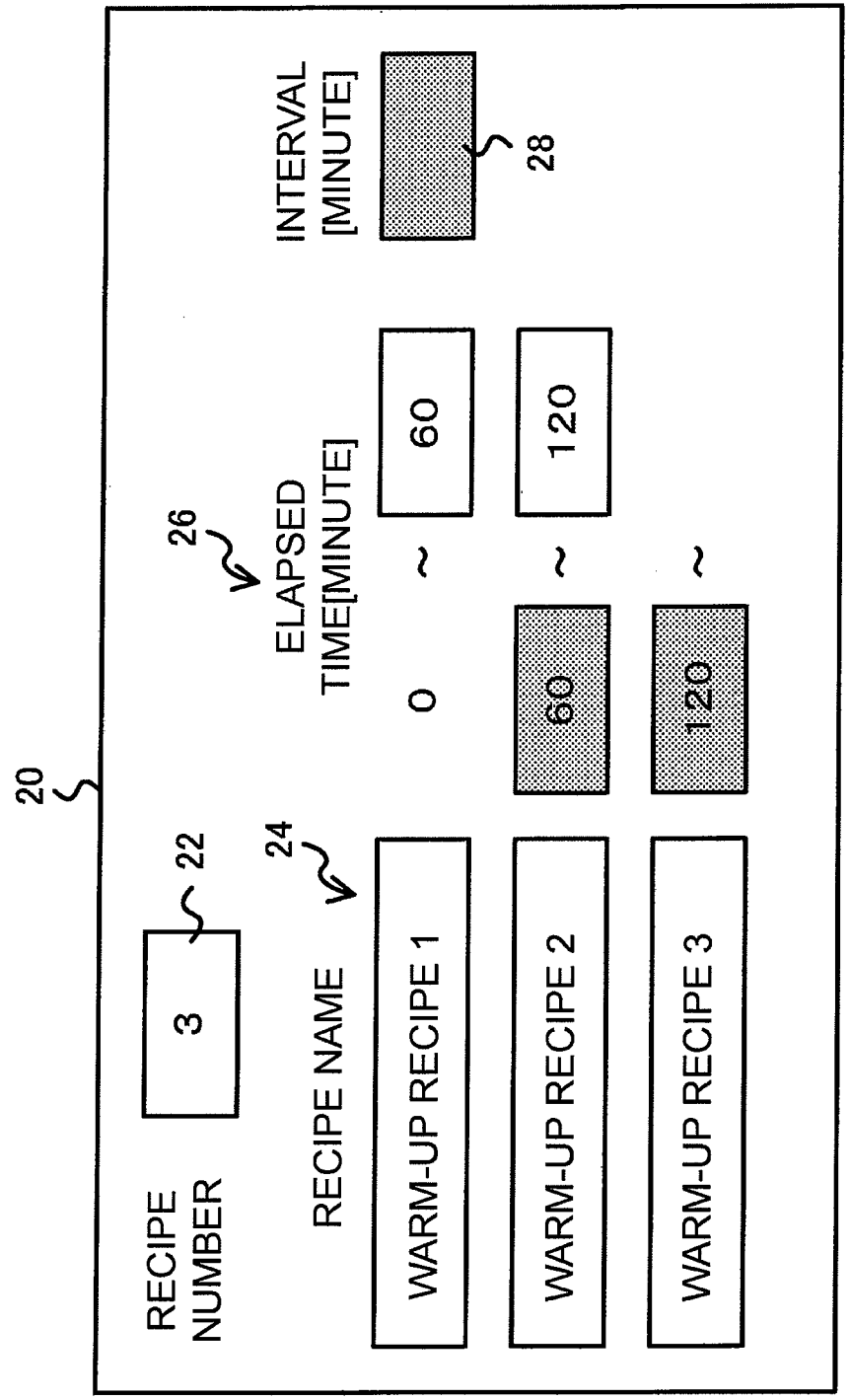
FIG. 6 is a view showing a maintenance recipe setup screen 20 displayed by a manipulation unit 12, and showing an example of setting the operation of a maintenance recipe shown in FIG. 4.

FIG. 6 is a view showing a maintenance recipe setup screen 20 displayed by the manipulation unit 12, and showing an example of setting the operation of the maintenance recipe shown in FIG. 4.

As shown in FIG. 6, the manipulation unit 12 displays the maintenance recipe setup screen 20, which enables a user to set the operation of the maintenance recipe through the maintenance recipe setup screen 20. The maintenance recipe may be set for each process chamber. That is, the same maintenance recipe may be set or different maintenance recipes may be set for the process chamber PM1 and the process chamber PM2.

The maintenance recipe setup screen 20 includes a recipe number setting unit 22, a recipe name setting unit 24, an elapsed time setting unit 26, and an interval setting unit 28. In the recipe number setting unit 22, the number of an operating maintenance recipe is determined. In the recipe name setting unit 24, the name of an operating maintenance recipe is determined. In the elapsed time setting unit 26, time when the maintenance recipe determined in the recipe name setting unit 24 is determined as time elapsed after the transition to the standby (ready) state. The interval setting unit 28 will be explained later.

In the setting example shown in FIG. 6, the number of recipes is 3, and the warm-up recipe 1 as a first maintenance recipe is executed for 60 minutes after the execution of the final production processing recipe is completed. In addition, the warm-up recipe 2 as a second maintenance recipe is executed for next 60 minutes after the execution of the warm-up recipe 1 is completed, and the warm-up recipe 3 as a third maintenance recipe is executed after the elapsed time of 120 minutes from the completion of the corresponding production processing recipe.

Also, in the maintenance recipe setup screen 20 shown in FIG. 6, a maximum of three maintenance recipes may be determined at intervals, however, a maximum number of the maintenance recipes is not limited thereto. That is, in the maintenance recipe setup screen 20, the four or more maintenance recipes may be determined.

Figure 7:
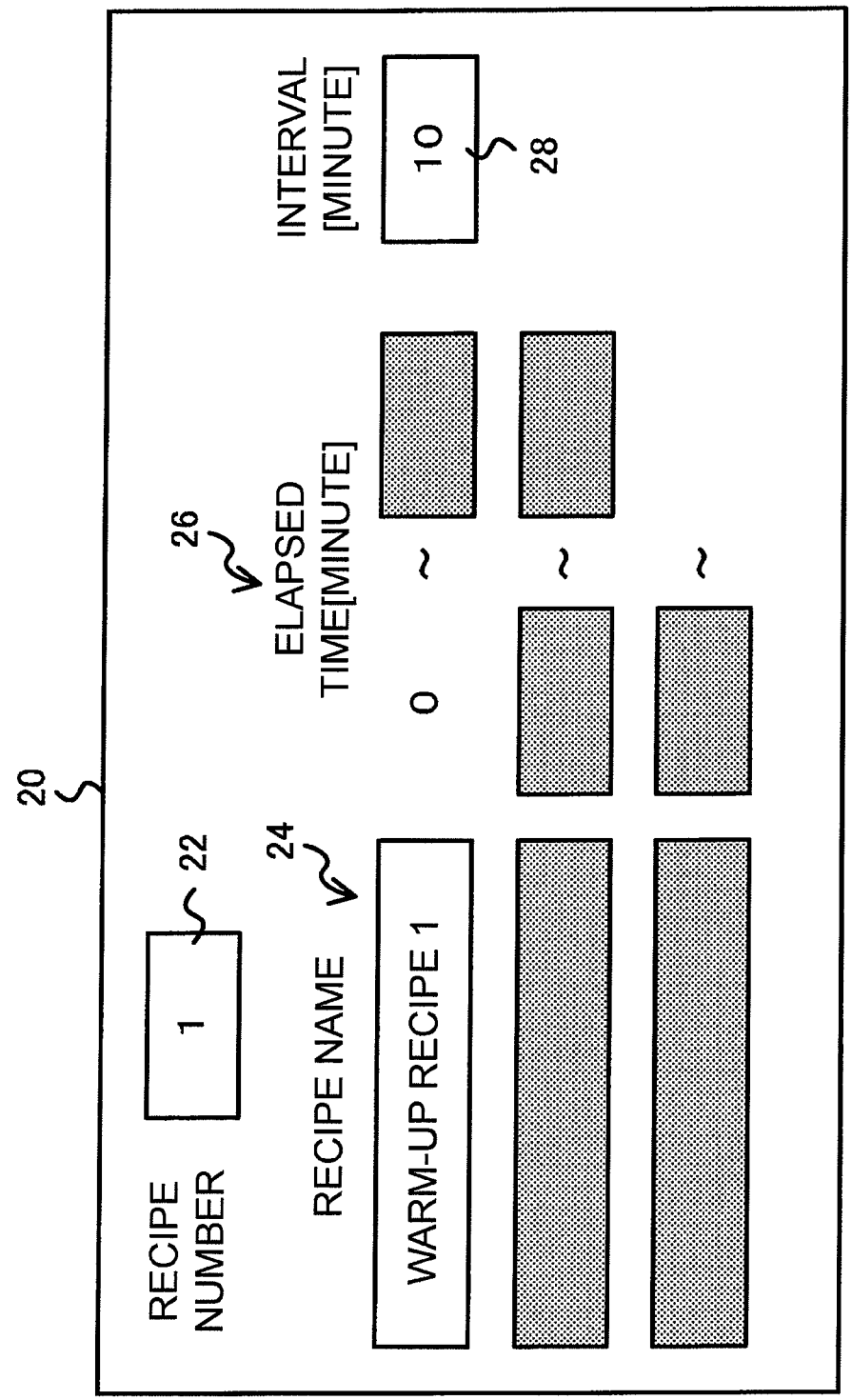
FIG. 7 is a view showing a maintenance recipe setup screen 20 displayed by a manipulation unit 12 and showing an example of setting the operation of a maintenance recipe shown in FIG. 5.

FIG. 7 is a view showing a maintenance recipe setup screen 20 displayed by the manipulation unit 12 and showing an example of setting the operation of the maintenance recipe shown in FIG. 5.

As shown in FIG. 7, by determining a value in the interval setting unit 28, the maintenance recipe is executed at predetermined intervals. That is, in the interval setting unit 28, the interval time of operating the maintenance recipe determined in the recipe name setting unit 24 is determined. In the setting example shown in FIG. 7, the number of recipes is 1, and the warm-up recipe 1 as a first maintenance recipe is executed after 10 minutes from the completion of execution of the final production processing recipe. Furthermore, the warm-up recipe 1 is repeatedly executed after 10 minutes from the completion of execution of the corresponding warm-up recipe 1.

Figure 8:
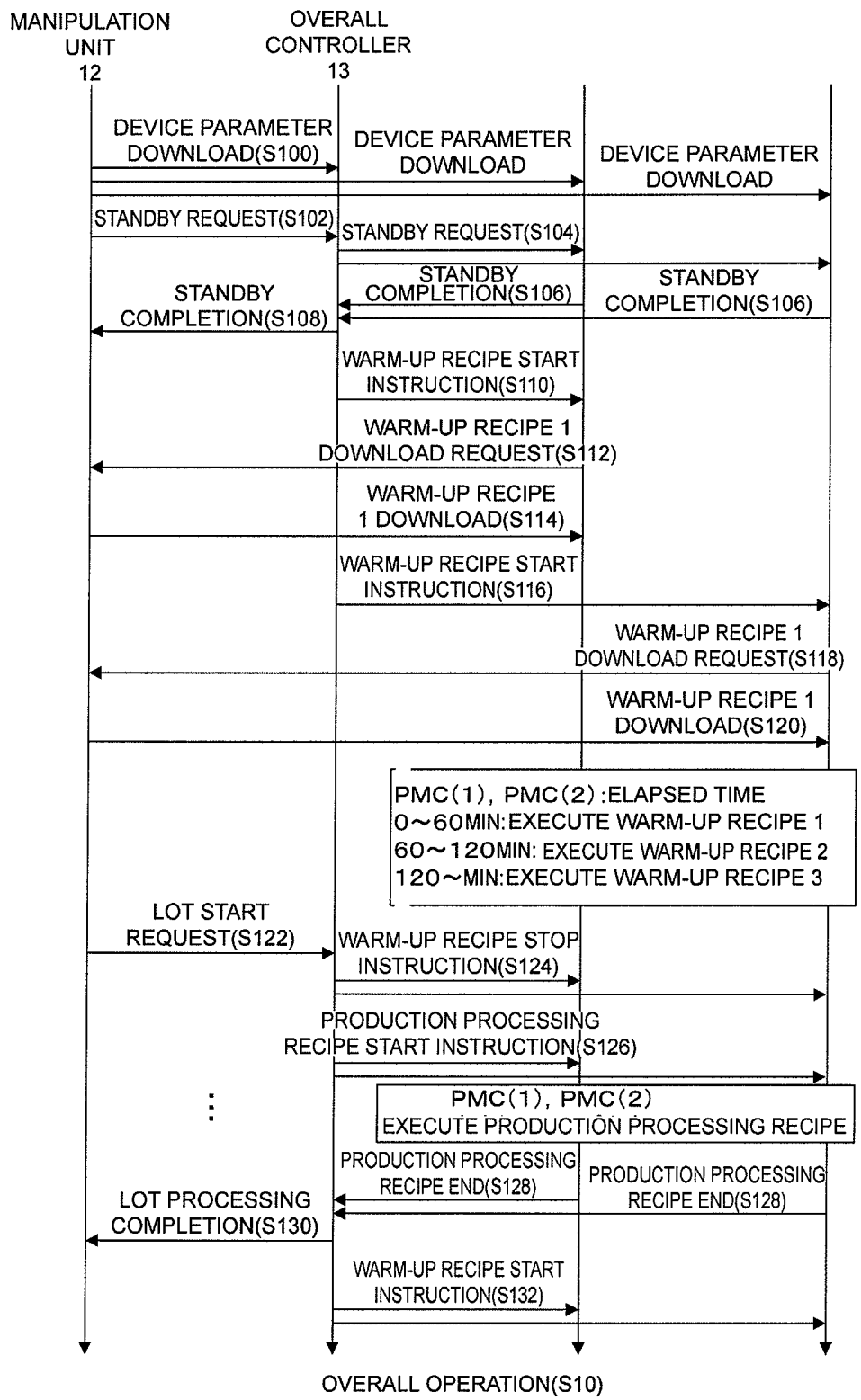
FIG. 8 is a sequential view showing an overall operation S10 of the semiconductor manufacturing apparatus 1 and showing a case that the operation of a maintenance recipe is set as shown in FIG. 6, in accordance with an embodiment of the present invention.

FIG. 8 is a sequential view showing an overall operation S10 of the semiconductor manufacturing apparatus 1 and showing a case that the operation of a maintenance recipe is set as shown in FIG. 6, in accordance with an embodiment of the present invention.

As shown in FIG. 8, when the semiconductor manufacturing apparatus 1 starts, it transits to the idle state. In step 100 (S100), the manipulation unit 12 is connected to the PMC(1) 14 and the PMC(2) 15 to transfer (download) a device parameter including a value determined through the maintenance recipe setup screen 20 (refer to FIG. 6) to the overall controller 13, the PMC(1) 14 and the PMC(2) 15.

When the manipulation unit 12 receives the standby request, the semiconductor manufacturing apparatus 1 transits to the standby state. That is, in step 102 (S102), the manipulation unit 12 outputs the standby request to the overall controller 13.

In step 104 (S104), the overall controller 13 outputs the standby request to the PMC(1) 14 and the PMC(2) 15.

In step 106 (S106), the PMC(1) 14 or the like outputs the standby completion notice indicating the normal end of the standby processing to the overall controller 13.

The overall controller 13 receives the standby completion notice, and then in step 108 (S108), outputs the standby completion notice to the manipulation unit 12. This allows the semiconductor manufacturing apparatus 1 to transit from the standby state to the standby (ready) state.

In step 110 (S110) and step 116 (S116), the overall controller 13 instructs the PMC(1) 14 and the PMC(2) 15 to start the maintenance recipe.

In step 112 (S112) and step 118 (S118), the PMC(1) 14 and the PMC(2) 15 refer to the device parameter. In the device parameter, a warm-up recipe 1 has been determined as a maintenance recipe that operates during an initial time period. Therefore, the PMC(1) 14 or the like request the manipulation unit 12 for download of the warm-up recipe 1.

In step 114 (S114) and step 120 (S120), the PMC(1) 14 and the PMC(2) 15 download the warm-up recipe 1 from the manipulation unit 12.

When the downloading is completed, the PMC(1) 14 and the PMC(2) 15 execute the warm-up recipe 1 for 60 minutes after the transition to the standby (ready) state.

When 60 minutes are elapsed, the PMC(1) 14 or the like download the warm-up recipe 2, and then execute the warm-up recipe 2 for next 60 minutes. When 120 minutes are elapsed from the transition to the standby (ready) state, the PMC(1) 14 or the like download and execute the warm-up recipe 3. As such, the PMC(1) 14 or the like execute repeatedly the maintenance recipes until the lot processing starts.

In step 122 (S122), the manipulation unit 12 receives the lot processing request, and requests the overall controller 13 to start the lot processing. This allows the semiconductor manufacturing apparatus 1 to transit from the standby (ready) state to the run state.

In step 124 (S124), the overall controller 13 instructs the PMC(1) 14 and the PMC(2) 15 to stop the maintenance recipe. Then, the PMC(1) 14 or the like stops repeating the execution of the maintenance recipe. If the maintenance recipe is being executed, the PMC(1) 14 or the like stop the corresponding maintenance recipe after completing it.

In step 126 (S126), the overall controller 13 instructs the PMC(1) 14 and the PMC(2) 15 to start the production processing recipe. The PMC(1) 14 or the like receive the start instruction of the production processing recipe, and then executes the production processing recipe.

In step 128 (S128), when the production processing recipe is completed, the PMC(1) 14 and the PMC(2) 15 transfer the completion notice of the production processing recipe to the overall controller 13.

The overall controller 13 receives the completion notice of the production processing recipe, and then in step 130 (S130), outputs the completion notice of the lot processing to the manipulation unit 12. This allows the semiconductor manufacturing apparatus 1 to transit from the run state to the standby (ready) state.

In step 132 (S132), the overall controller 13 instructs the PMC(1) 14 and the PMC(2) 15 to start the maintenance recipe. Thereafter, the maintenance recipe is executed in the same manner as S110 and S116 or later.

Figure 9:
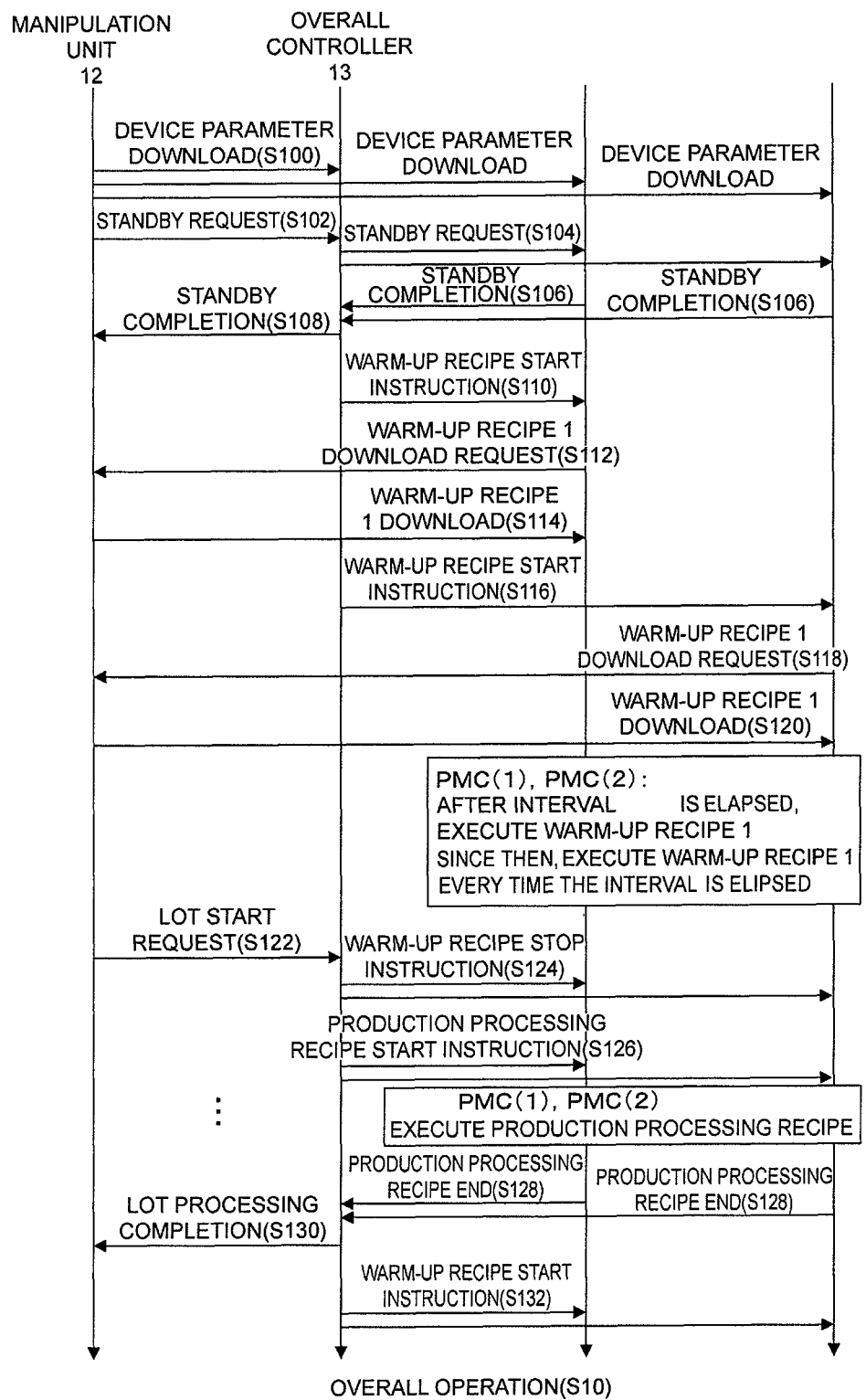
FIG. 9 is a sequential view showing an overall operation S20 of the semiconductor manufacturing apparatus 1 and showing a case that the operation of a maintenance recipe is set as shown in FIG. 7, in accordance with an embodiment of the present invention.

FIG. 9 is a sequential view showing an overall operation S20 of the semiconductor manufacturing apparatus 1 and showing a case that the operation of a maintenance recipe is set as shown in FIG. 7, in accordance with an embodiment of the present invention.

Also in FIG. 8 and FIG. 9, the same reference numerals are used for the substantially same steps.

As shown in FIG. 9, in S112 and S120, the PMC(1) 14 and the PMC(2) 15 download the warm-up recipe 1 and execute the determined maintenance recipe at predetermined intervals. For example, when 10 minutes are elapsed after the transition to the standby (ready) state, the PMC(1) 14 or the like execute the warm-up recipe 1 as the maintenance recipe. When 10 minutes are elapsed after completion of the warm-up recipe 1, the PMC(1) 14 or the like execute the warm-up recipe 1 again. As such, the PMC(1) 14 or the like executes repeatedly the maintenance recipe until the lot processing starts. Furthermore, it is preferable that the maintenance recipe has the same processing conditions as the production processing recipe because atmosphere inside the process chamber PM during one lot processing and another processing become equal to atmosphere inside the process chamber PM for the lot processing period. Moreover, if it is certain that the atmosphere inside the process chamber PM during one lot processing and another lot processing become equal to atmosphere inside the process chamber PM for the lot processing period, another processing condition may be set. For example, a heating time may be set to be shorter or longer. Furthermore, the above processing conditions may be different from the production processing recipe. For example, a process gas may not be flown, or only an inert gas may be flown. In the plasma generating process, if the production processing recipe is executed without placing the wafer on the susceptor, it is worry about the damage of the susceptor by plasma, but the damage due to plasma is suppressed.

Therefore, if the temperature inside the process chambers PM1 and PM2 increases, for example, to 900° C. or more in the production processing and decreases to about a room temperature after the production processing, even though an interval is increased between production processes, the atmosphere inside the process chambers PM1 and PM2 is maintained (maintained at a predetermined temperature). This makes it possible to omit operations of changing a setting of the production recipe, or performing a dummy processing or a preprocessing before starting the production processing. Therefore, time of starting the production processing can be diminished. That is, in the current embodiment, since the production processing recipe can be executed immediately in the run state, the productivity of the apparatus can be improved compared with the case of executing the dummy processing or preprocessing in the run state. In addition, since the maintenance recipe can be made in the same way as a usual production processing recipe, the control of pressure, gas valve/MFC or the like can be determined by the maintenance recipe. In executing the maintenance recipe, because there is no wafer in the process chamber PM, the mechanism operation inside the process chamber PM, such as upward/downward movement of the susceptor, may not be set. That is, several operations are possible by changing the processing conditions or the setting items of the mechanism part or the like. For example, the processing conditions are made to be the same as the production processing recipe, and the setting of the mechanism part or the like is made not to be moved. In this way, it is possible to suppress the unnecessary movement, consumption or degradation of the mechanism part. Furthermore, in the current embodiment, explanation has been given on the in-line type semiconductor manufacturing apparatus, however, it is obvious that the present invention can also be applied to a cluster type semiconductor manufacturing apparatus.

Next, explanation will be given on a substrate processing apparatus in accordance with a second embodiment of the present invention.

The substrate processing apparatus, for example, is constructed as a semiconductor manufacturing apparatus used for a method of manufacturing a semiconductor device (IC). Also, in the following description, explanation will be given on an embodiment where a vertical type substrate processing apparatus performing oxidation, diffusion, or CVD on a substrate is applied.

Figure 10:
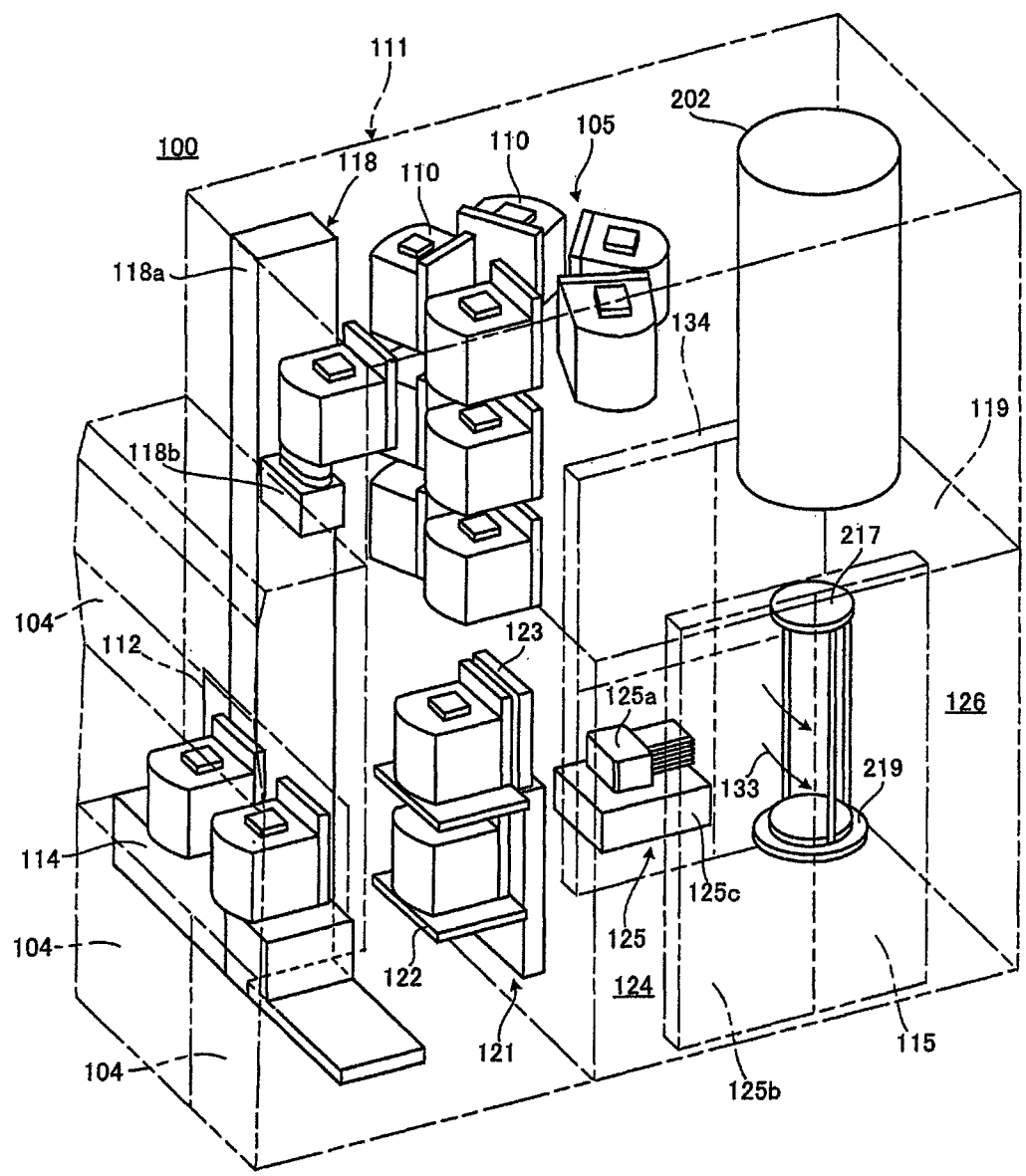
FIG. 10 is a perspective view of a substrate processing apparatus 100 in accordance with a second embodiment of the present invention.

FIG. 10 is a perspective view of a substrate processing apparatus 100 in accordance with an embodiment of the present invention.

Figure 11:
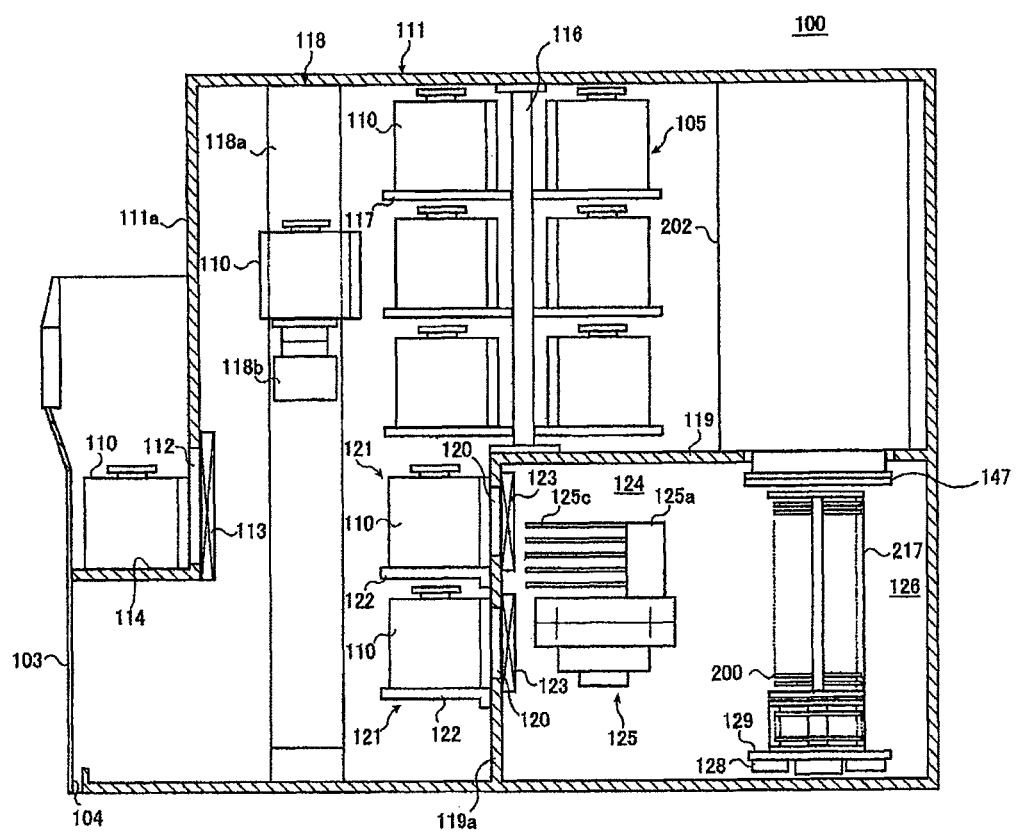
FIG. 11 is a side perspective view of the substrate processing apparatus 100.

FIG. 11 is a side perspective view of the substrate processing apparatus 100 shown in FIG. 10.

As shown in FIG. 10 and FIG. 11, the substrate processing apparatus 100 in accordance with the embodiment of the present invention is provided with a housing 111. In the substrate processing apparatus 100, a FOUP (Front Opening Unified Pod, hereinafter, referred to as a pod) 110 is used as a wafer carrier receiving a wafer (substrate) 200 made of a material such as silicon. At the front part of a front wall 111a of the housing 111, a front maintenance gate 103 is installed as an opening part for maintenance, and front maintenance doors 104 are installed to open and close the front maintenance gate 103.

At the front wall 111a of the housing 111, a pod carrying in/out opening (substrate container carrying in/out opening) 112 is provided in communication with the inside and outside of the housing 111, and the pod carrying in/out opening 112 is designed to be opened and closed by a front shutter (mechanism for opening/closing the substrate container carrying in/out opening) 113. A load port (substrate container transferring table) 114 is installed at the front side of the pod carrying in/out opening 112, and the pod 110 is placed on the load port 114 and aligned. The pod 110 is designed to be carried onto/out of the load port 114 by an in-plant carrying apparatus (not shown).

At an about upper middle part of the housing 111 in a front and rear direction, a rotatable pod shelf (substrate container placement shelf) 105 is installed, and the rotatable pod shelf 105 is configured to accommodate a plurality of pods 110. That is, the rotatable pod shelf 105 includes a post 116 and a plurality of shelf plates (substrate container placement table) 117. The post 116 is raised and extends in a planar form, and rotates intermittently and transversely. The shelf plates 117 are disposed respectively at upper, middle, and lower stages of the post 116, and are supported radially. The plurality of shelf plates 117 are configured to hold the plurality of pods 110 placed thereon, respectively.

Between the load port 114 and the rotatable pod shelf 105 in the housing 111, a pod carrying unit (substrate container carrying unit) 118 is installed. The pod carrying unit 118 is configured by a pod elevator (substrate container elevating mechanism) 118a, which may move upward and downward in a state of holding the pod 110, and a pod carrying mechanism (substrate container carrying mechanism) 118b. The pod carrying unit 118 is configured to carry the pod 110 among the load port 114, the rotatable pod shelf 105, and a pod opener (substrate container cover opening/closing mechanism) 121 by consecutive operations of the pod elevator 118a and the pod carrying mechanism 118b.

At an approximately lower middle part of the housing 111 in a front and rear direction, a sub housing 119 is formed at the rear end. At a front wall 119a of the sub housing 119, a pair of wafer carrying in/out openings (substrate carrying in/out openings) 120 are vertically arranged in upper and lower stages, in order to carry the wafer 200 in/out of the sub housing 119. The pod openers 121 are installed at upper and lower stages in the wafer carrying in/out openings 120, respectively. Each of the pod openers 121 includes a placement table 122 on which the pod 110 is placed and a cap detaching/attaching mechanism (cover detaching/attaching mechanism) 123 for detaching a cap (cover) of the pod 110. The pod opener 121 is configured to open/close a wafer loading/unloading port of the pod 110 by detaching/attaching the cap of the pod 110 placed on the placement table 122 using the cap detaching/attaching mechanism 123.

The sub housing 119 constitutes a transfer chamber 124 fluidically isolated from an install space of the pod carrying unit 118 or the rotatable pod shelf 105. A wafer transfer mechanism (substrate transfer mechanism) 125 is installed in a front area of the transfer chamber 124. The wafer transfer mechanism 125 is configured by a wafer transfer unit (substrate transfer unit) 125a capable of rotating or directly moving the wafer 200 in a transverse direction and a wafer transfer unit elevator (substrate transfer unit elevating mechanism) 125b for moving the wafer transfer unit 125a upward and downward. As shown in FIG. 10, the wafer transfer unit elevator 125b is installed between a right end of the pressure-resistive housing 111 and a front and right end of the transfer chamber 124 of the sub housing 119. By consecutive operations of the wafer transfer unit 125a and the wafer transfer unit elevator 125b, the wafer 200 is charged/discharged into/from a boat (substrate holding tool) 217 using tweezers (substrate holding body) 125c of the wafer transfer unit 125a as a placement unit of the wafer 200.

In a rear area of the transfer chamber 124, a standby unit 126 is installed to accommodate the boat 217 in the standby state. Over the standby unit 126, a process chamber 202 is installed. A lower end of the process chamber 202 is configured to be opened and closed by a furnace port shutter (furnace port opening/closing mechanism) 147.

As shown in FIG. 10, a boat elevator (substrate holding tool elevating mechanism) 115 for moving the boat 217 upward and downward is installed between a right end of the pressure-resistive housing 111 and a right end of the standby unit 126 of the sub housing 119. A seal cap 219 as a cover is transversely installed in arms 128 as a connecting tool connected to an elevating table of the boat elevator 115. The seal cap 219 is configured to support the boat 217 vertically and close the lower end of the process chamber 202. The boat 217 includes a plurality of holding members and is configured to hold a plurality of sheets (for example, from about 50 to 150 sheets) of wafers 200 each horizontally, in a state that the centers thereof are aligned and put in a vertical direction.

As shown in FIG. 10, at a left end of the transfer chamber 124, opposite side to the wafer transfer unit elevator 125b and the boat elevator 115, a clean unit 134 with a supply fan and a dust-proof filter is installed. The clean unit 134 is configured to make a flow of clean air 133 that is purified atmosphere or an inert gas. Although not shown, a notch alignment unit 135 is installed as a substrate alignment unit for aligning wafers in a circumferential direction between the wafer transfer unit 125a and the clean unit 134.

The clean air 133 supplied from the clean unit 134 flows through the notch alignment unit 135, the wafer transfer unit 125a, and the boat 217 of the standby unit 126. Thereafter, the clean air 133 is drawn by a duct (not shown) and exhausted out of the housing 111, or is circulated to a first side (supply side) that is a drawing side of the cleaning unit 134 and is supplied into the transfer chamber 124 again by the clean unit 134.

Next, explanation will be given on an operation of the substrate processing apparatus 100 in accordance with an embodiment of the present invention.

As shown in FIG. 10 and FIG. 11, when the pod 110 is supplied to the load port 114, the pod carrying in/out opening 112 is opened by the front shutter 113, and the pod 110 on the load port 114 is carried into the housing 111 from the pod carrying in/out opening 112 by the pod carrying unit 118.

The carried pod 110 is automatically transferred onto the specified shelf plate 117 of the rotatable pod shelf 105 by the pod carrying unit 118 and temporarily stored thereon. Thereafter, the pod 110 is transferred from the shelf plate 117 to one pod opener 121 and temporarily stored, and then is carried from the shelf plate 117 to one pod opener 121 and transferred on the placement table 122, or is directly carried to the pod opener 121 and transferred onto the placement table 122. Here, the wafer carrying in/out opening 120 of the pod opener 121 is closed by the cap detaching/attaching mechanism 123, and the transfer chamber 124 is filled with the clean air 133. For example, as the transfer chamber 124 is filled with a nitrogen gas as the clean air 133, the inside of the transfer chamber 124 is set to 20 ppm or lower, much lower than the oxygen concentration of the inside (atmosphere) of the housing 111.

An opening side of the pod 110 placed on the placement table 122 is pushed to an opening of the wafer carrying in/out opening 120 in the front wall 119a of the sub housing 119. At the same time, the cap is released by the cap detaching/attaching mechanism 123 and the wafer loading/unloading port is opened.

When the pod 110 is opened by the pod opener 121, the wafer 200 is picked up from the pod 110 by the tweezers 125c of the wafer transfer unit 125a through the wafer door, and is aligned using the notch alignment (not shown) 135. Then, the wafer 200 is carried into the standby unit 126 at the backside of the transfer chamber 124, and charged into the boat 217. The wafer transfer unit 125a that has transferred the wafer 200 to the boat 217 returns to the pod 110, and charges the next wafer 110 into the boat 217.

While the wafer is charged into the boat by the wafer transfer mechanism 125 from one pod opener 121 (upper or lower stage), another pod 110 is transferred from the rotatable pod shelf 105 to the other pod opener 121 (lower or upper stage) by the pod carrying unit 118, and at the same time, the pod 110 is opened by the pod opener 121.

When predetermined sheets of wafers 200 are charged into the boat 217, the lower end of the process chamber 202, which has been closed by the furnace port shutter 147, is opened by the furnace port shutter 147. Subsequently, as the seal cap 219 is raised by the boat elevator 115, the boat 217 holding a group of wafers 200 is loaded into the process chamber 202.

After loading, a certain processing is performed on the wafer 200 in the process chamber 202. After the processing, the wafer 200 and the pod 110 are unloaded from the housing 111 in a reverse order of the above-described one, except for the alignment of the wafer using the notch alignment unit (not shown) 135.

Next, explanation will be given on a PMC 34 for controlling elements of the substrate processing apparatus 100.

Figure 12:
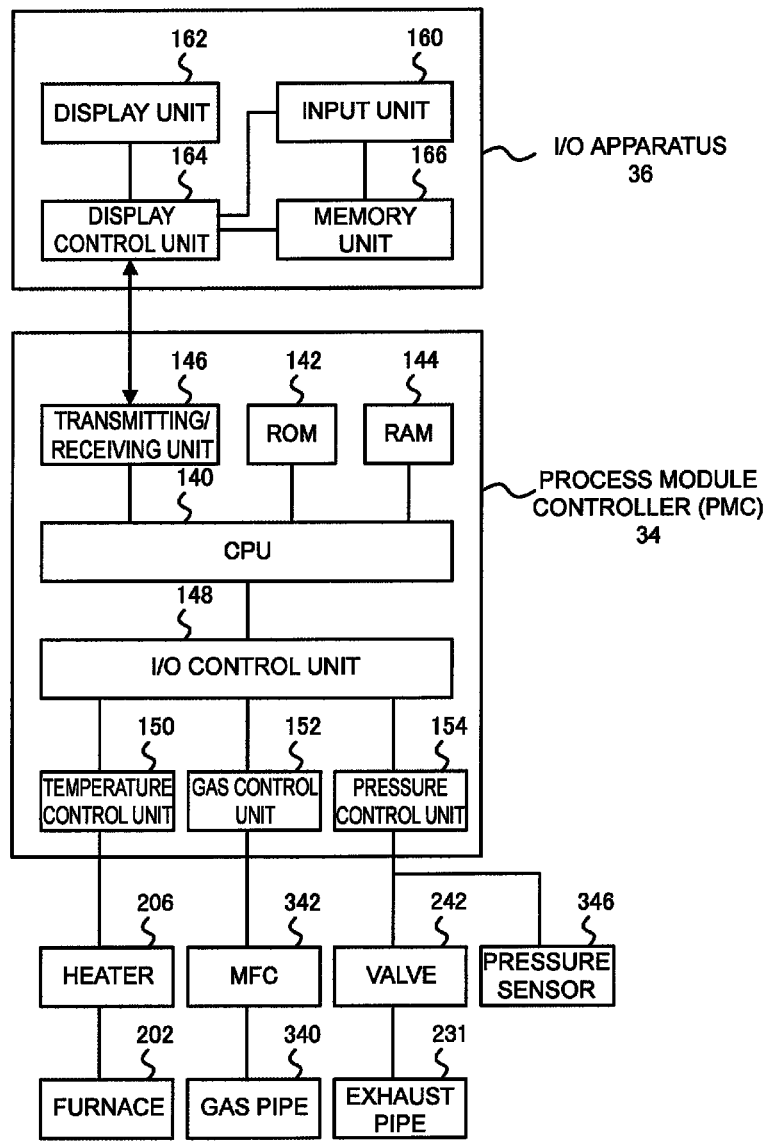
FIG. 12 is a view showing the hardware configured around a PMC 34.

FIG. 12 is a view showing the hardware configured around a PMC 34.

The PMC (control unit) 34 includes a CPU 140, a read-only memory (ROM) 142, a random-access memory (RAM) 144, a transmitting/receiving unit 146, a temperature control unit 150, a gas control unit 152, a pressure control unit 154, a carrying control unit (not shown), and an I/O control unit 148. The transmitting/receiving unit 146 receives/transmits data from/to an I/O unit 36, and the I/O control unit 148 executes I/O control of the temperature control unit 150, or the like. The CPU 140 outputs control data (control instruction) for processing the substrate to the temperature control unit 150, the gas control unit 152, and the pressure control unit 154, based on recipes that are created or edited on a manipulation screen of the I/O unit 36 and stored in the RAM 144, or the like.

Additionally, the CPU 140 outputs the control instruction to the carrying control unit (not shown) in the same manner.

Sequence program, a plurality of recipes, input data (input instruction) inputted from the I/O unit 36, commands of the recipes, history data of the recipes or the like are stored in the ROM 142 and the RAM 144. In addition, the PMC 34 may include a memory device (not shown) realized by a hard disk drive (HDD) or the like, and in this case, data similar to that stored in the RAM 144 is stored in the memory device.

The I/O unit 36 includes an input unit 160, a display unit 162, a temporary memory unit 166, and a display control unit 164. The input unit 160 receives input data (input instruction) of an operator (user) from the manipulation screen. The display unit 162 displays data stored in the RAM 144 or the like. The temporary memory unit 166 stores the input data received to the input unit 160 until the data is transmitted to the transmitting/receiving unit 146 by the display control unit 164. The display control unit 164 receives input data (input instruction) from the input unit 160, and transmits the input data to the display unit 162 or the transmitting/receiving unit 146. In addition, as described later, the display control unit 164 is configured to receive instruction (execution instruction) from the CPU 140 and to execute a certain recipe among a plurality of recipes stored in the ROM 142 or the RAM 144 from the CPU 140. Also, the display unit 162 is configured to display a certain recipe on the manipulation screen by instruction of the display control unit 164.

The temperature control unit 150 controls a temperature inside the process chamber 202 by a heater 206 installed in an outer circumference of the process chamber 202. The gas control unit 152 controls a supply amount of a reactive gas to be supplied into the process chamber 202 based on an output value from a mass flow controller (MFC) 342 installed in a gas pipe 340 of the process chamber 202. The pressure control unit 154 controls a pressure inside the process chamber 202 by opening/closing a valve 242 based on an output value of a pressure sensor 346 installed in an exhaust pipe 231 of the process chamber 202. As such, the temperature control unit 150 or the like perform a control of each unit (the heater 206, the MFC 342, the valve 242 or the like) of the substrate processing apparatus 100 based on a control instruction of the CPU 140.

For example, when data for setting a recipe is inputted by the input unit 160 of the I/O unit 36, the input data (input instruction) is stored in the memory unit 166 and at the same time displayed on the display unit 162 through the display-control unit 164, and is also transmitted to the transmitting/receiving unit 146 of the PMC 34 by the display control unit 164. The CPU 140 stores the input data in the RAM 144, and determines the set input of the recipe stored in, for example, the ROM 142. As the CPU 140 activates the sequence program and executes the command of the recipe stored in, for example, the RAM 144 according to the sequence program, the steps are executed successively, and the control instruction for processing the substrate is transmitted to the temperature control unit 150, the gas control unit 152, the pressure control unit 154, and the carrying control unit through the I/O control unit 148. The temperature control unit 150 or the like perform a control of each unit (the heater 206, the MFC 342, and the valve 242 or the like) in the substrate processing apparatus 100 in response to main control instructions. As such, the above-described processing of the wafer 200 is performed.

Figure 13:
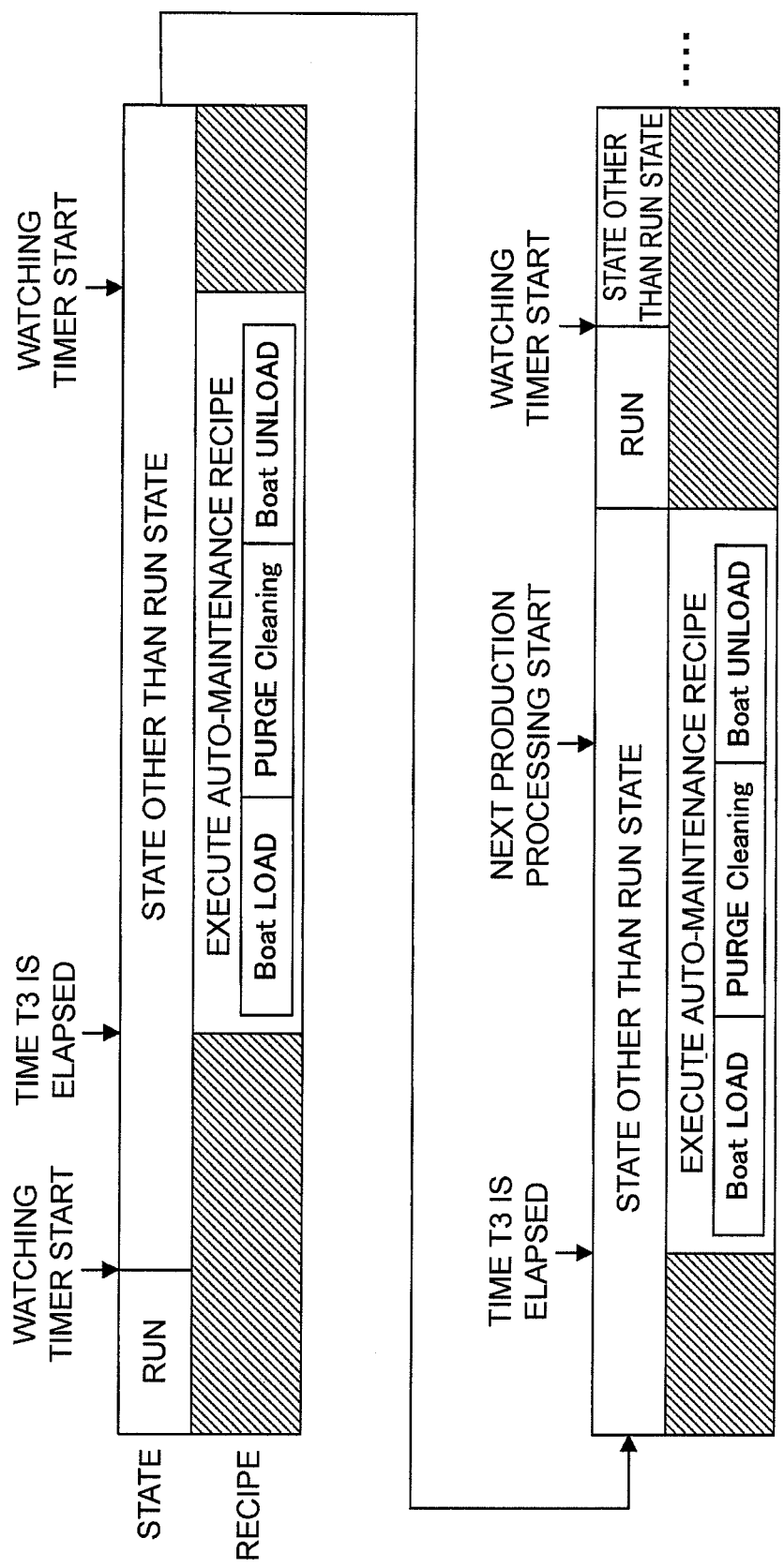
FIG. 13 is a view showing the relationship of the state of the substrate processing apparatus 100 and the operation of a maintenance recipe executed repeatedly at predetermined intervals.

FIG. 13 is a view showing the relationship of the state of the substrate processing apparatus 100 and the operation of a maintenance recipe executed repeatedly at predetermined intervals. Also, in FIG. 13, only the operation of the maintenance recipe is shown and the operation of the production processing recipe is not shown.

As shown in FIG. 13, in the substrate processing apparatus 100 in accordance with the current embodiment, at time except for an execution of process processing, that is, at time except for the run state of the substrate processing apparatus 100, an auto-maintenance recipe is executed as a maintenance recipe. The auto-maintenance recipe is a recipe for removing layers deposited inside the process chamber 202 or contaminants such as organic materials attached to the boat 217 in the transfer chamber 124.

In more detail, the auto-maintenance recipe includes sections such as "Boat LOAD", "PURGE Cleaning", and "Boat UNLOAD". In "Boat LOAD", a part where at least the boat 217 is placed is loaded into the process chamber 202. In "PURGE Cleaning", a cleaning is performed. In "Boat UNLOAD", a part where at least the boat 217 is placed is unloaded from the process chamber 202. Herein, there are some cases where the boat 217 is not placed for several reasons such as materials of the boat 217.

After completion of the substrate processing (batch process), when the substrate processing apparatus 100 transits from the run state to the state other than the run state, the PMC 34 of the substrate processing apparatus 100 starts operation of the watch timer. When T3 time is elapsed after the start of the operation, the PMC 34 executes the auto-maintenance recipe. When the execution of the auto-maintenance recipe is completed, the PMC 34 starts operating the watch timer again. Therefore, the auto-maintenance recipe is executed repeatedly at predetermined intervals while the substrate processing apparatus 100 is in the state other than the run state.

The PMC 34, when received an instruction of next production processing, starts the next production processing after the execution of the auto-maintenance recipe is completed. That is, if the PMC 34 receives the instruction of next production processing while the auto-maintenance recipe is being executed, the auto-maintenance recipe does not stop halfway and is executed until the completion. Herein, when the execution of the auto-maintenance recipe is completed and the watching timer is operating (that is, the auto-maintenance recipe is not executed), if the instruction of the next production processing is received, it is apparent that a substrate for the next production processing is loaded and the substrate processing (batch process) is started.

In the current embodiment, if the substrate processing apparatus is left uncontrolled, contaminants such as organic materials are attached to the inside of the process chamber 202 or the boat 217 placed in the wafer transfer chamber 124. However, because the cleaning is performed periodically, in the next production processing, the wafer processing can be performed more quickly than the case where the cleaning is performed (only one time) just before the start of the production processing. In the current embodiment, if the next production processing is started within a predetermined time after the completion of the maintenance recipe, the next production processing can be performed immediately. Meanwhile, in a case where the cleaning is performed only one time just before the start of the next production processing, there are many uncertain factors changing the optimal processing conditions, such as how long the apparatus is left uncontrolled (uncontrolled time) or mechanical difference of the devices. Therefore, it is very difficult to calculate the optimal conditions and consequently the start of the next production processing is delayed. Furthermore, in the operation of executing the cleaning only one time, it is necessary to set the cleaning conditions at each time. Therefore, execution of the cleaning only one time just before the start of the production processing is not preferable in view of operation. Therefore, although the substrate processing apparatus 100 is not used for a while by a production plan or the like and then is used again, there is no need for a user to execute a cleaning recipe before use. Also, since the maintenance recipe is executed while the substrate processing apparatus 100 does not execute the production processing, the contamination of a wafer can be prevented even if a user does not execute a cleaning recipe before use. Furthermore, a plurality of maintenance recipes may be prepared and the recipes with predetermined conditions may be executed. Moreover, in the current embodiment, it is obvious that the recipes can be set in the setup screen as shown in FIG. 6 and FIG. 7 and executed. Furthermore, it is obvious that the auto-maintenance recipe can arbitrarily change the time setting of the Purge Cleaning step, the flow rate setting of the cleaning gas or the inert gas, and the temperature or pressure setting. Moreover, the setting change of the processing conditions may be performed in a region where the cleaning is performed.

Figure 14:
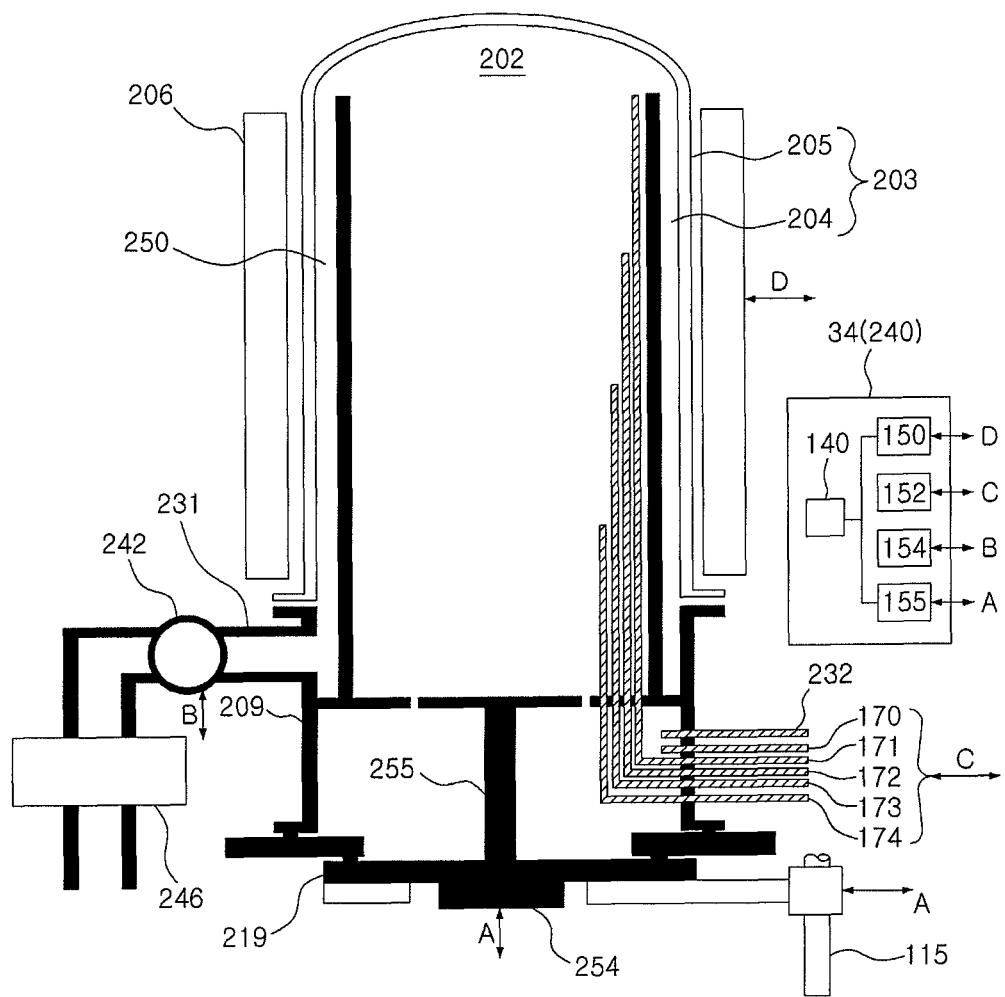
FIG. 14 is a schematic view showing the process chamber 202 of the substrate processing apparatus 100 in accordance with the second embodiment of the present invention.

FIG. 14 is a schematic vertical cross-sectional view showing the process chamber 202 of the substrate processing apparatus 100 which is suitably used in accordance with the embodiment of the present invention.

As shown in FIG. 14, the process chamber 202 includes a heater 206 as a heating mechanism. The heater 206 has a cylindrical shape. At the inside of the heater 206, a process tube 203 as a reaction tube is installed concentrically with the heater 206. The process tube 203 is configured by an inner tube 204 as an inner reaction tube, and an outer tube 205 as an outer reaction tube installed outside of the inner tube 204. The inner tube 204 is made of a heat-resistant material such as quartz ($SiO_2$) or silicon carbide (SiC), and is formed in a cylindrical shape with its upper and lower parts opened. At the cylindrical hollow part of the inner tube 204, the process chamber 202 is formed. The outer tube 205 is made of a heat-resistant material such as quartz or silicon carbide. An inner diameter of the outer tube 205 is greater than an outer diameter of the inner tube 204, and the outer tube 205 is formed in a cylindrical shape with an upper part closed and a lower part opened. The outer tube 205 is installed concentrically with the inner tube 204. Also, although it is shown in FIG. 14 that the boat 217 is not placed, the boat 217 which is not charged with the wafer 200 may also be loaded into the process chamber 202.

At the lower part of the outer tube 205, a manifold 209 is installed concentrically with the outer tube 205. The manifold 209 is made of a material such as a stainless steel and is formed in a cylindrical shape with its upper and lower parts opened. The manifold 209 is coupled to the inner tube 204 and the outer tube 205 and is installed to support them. In addition, an O-ring as a seal member is installed between the manifold 209 and the outer tube 205. A reaction vessel is configured by the process tube 203 and the manifold 209.

At the manifold 209, a gas exhaust pipe 231 for exhausting an atmosphere inside the process chamber 202 is installed. Likewise, gas supply pipes 232, 170, 171, 172, 173 and 174 are installed to pass through the manifold 209. The gas supply pipes 170, 171, 172, 173 and 174 are pipes for supplying a cleaning gas or inert gas. The gas supply pipe 232 is a pipe for supplying a substrate processing gas or inert gas.

The exhaust pipe 231 is installed at a lower part of a cylindrical space 250 formed by the gap between the inner tube 204 and the outer tube 205, and communicates with the cylindrical space 250. At the downstream part which is opposite to the connection part between the exhaust pipe 231 and the manifold 209, a vacuum exhaust device (vacuum pump) 246 is connected through a pressure sensor (not shown) as a pressure detector and an APC valve 242 as a pressure control device, and is configured to evacuate the process chamber 202 in order that the pressure inside the process chamber 202 has a predetermined level (vacuum degree). A pressure control unit 154 is electrically connected to the pressure control device 242 and the pressure sensor, and is configured to control the APC valve 242 at a desired timing in order to make the pressure inside the process chamber 202 to a desired level, based on the pressure detected by the pressure sensor.

At the lower part of the manifold 209, the seal cap 219 is installed as a furnace port lid which can air-tightly close the lower opening of the manifold 209. The seal cap 219 is configured to contact the lower part of the manifold 209 from a vertically lower side. The seal cap 219 is made of a metal such as a stainless steel and is formed in a disk shape. On the seal cap 219, an O-ring as a seal member is installed to contact the lower part of the manifold 209. At the side which is opposite to the process chamber 202 of the seal cap 219, a rotating mechanism 254 for rotating a boat is installed. A rotation shaft 255 of the rotating mechanism 254 passes through the seal cap 219 and is configured to rotate the boat 217. The seal cap 219 is configured so that it is moved in a vertical direction by a boat elevator 115 as an elevating mechanism installed vertically in the outside of the process tube 203.

At the inside of the process tube 203, a temperature sensor (not shown) as a temperature detector is installed. A temperature control unit 150 is electrically connected to the heater 206 and the temperature sensor, and is configured to control an electrified state of the heater 206, based on temperature information detected by the temperature sensor, to control a desired timing in order that temperature inside the processing chamber 202 is made to have a desired temperature distribution.

In the construction of the process chamber 202, the cleaning gas is introduced into the process chamber 202 through any one of the gas supply pipes 170, 171, 172, 173 and 174. In this case, the cleaning gas may be supplied through all the gas supply pipes. Also, the cleaning gas may be supplied through only the gas supply pipe 170, while the inert gas is supplied through the other gas supply pipes 171, 172, 173 and 174. Furthermore, the inert gas is introduced into the process chamber 202 through the gas supply pipe 232. Those gases are supplied by valves (not shown) or MFC controlled by the gas flow rate control unit 152. Moreover, the gas inside the process chamber 202 is exhausted from the process chamber 202 by the vacuum exhaust device connected to the gas exhaust pipe 231.

The gas flow rate control unit 152, the pressure control unit 154, the driving control unit 156, and the temperature control unit 150 are electrically connected to a main control unit 140 which controls the overall substrate processing apparatus. The gas flow rate control unit 152, the pressure control unit 154, the driving control unit 156, the temperature control unit 150, and the main control unit 140 are configured as a controller 240 corresponding to the PMC 34 of FIG. 12.

Next, explanation will be given on a cleaning method using the above-described construction of the process chamber 100 when a wafer is not loaded into the substrate processing apparatus 100. The cleaning is performed by executing the auto-maintenance recipe. In addition, in the following description, the operation of each part constituting the substrate processing apparatus 100 is controlled by the controller 240. First, the controller 240 executes the auto-maintenance recipe if the wafer 200 to be used in the next substrate processing (batch process) is not loaded until a predetermined time after completion of the substrate processing (batch process).

As shown in FIG. 14, in a state that the boat 217 is not placed, only a part supporting the boat 217 is moved upward by the boat elevator 115 and loaded into the process chamber 202. In this state, the seal cap 219 seals the lower part of the manifold 209 via the O-ring. The process chamber 202 is vacuum-exhausted by the vacuum exhaust device 246 in order that the inside of the process chamber 202 is made to have a desired pressure (vacuum degree). At this point, the pressure inside the process chamber 202 is measured by the pressure sensor (not shown), and the APC valve 242 as a pressure controller is feedback controlled based on the measured pressure. In addition, the process chamber 202 is heated by the heater 206 in order that the inside of the process chamber 202 is made to have a desired temperature. At this point, the electrified state of the heater 206 is feedback controlled based on the temperature information detected by the temperature sensor (not shown) in order that the inside of the process chamber 202 is made to have a desired temperature distribution. The step described above is the Boat LOAD step of FIG. 13. Although the boat 217 is not present in FIG. 14, it is obvious that the boat 217 may be loaded into the process chamber 202.

The cleaning gases are introduced into the process chamber 202 through the gas supply pipes 171, 172, 173 and 174. The introduced cleaning gases rise inside the process chamber 202 and are discharged from the upper opening of the inner tube 204 to the cylindrical space 250 and are exhausted through the exhaust pipe 231. When passing through the process chamber 202, the cleaning gases contact the locations such as the lower part or walls of the process chamber 202, thereby removing contaminants. Furthermore, the inside of the gas supply pipes 171, 172, 173 and 174 is also cleaned. When a preset time is elapsed, an inert gas supply source (not shown) supplies the inert gas to each gas supply pipe, so that gas inside the process chamber 202 is replaced with the inert gas and simultaneously the pressure of the process chamber 202 returns to atmospheric pressure. The step described above is the PURGE Cleaning step of FIG. 13.

Thereafter, the seal cap 219 is moved down by the boat elevator 115, and the lower part of the manifold 209 is opened. Simultaneously, at least a part holding the boat 217 is unloaded from the lower part of the manifold 209 to the outside of the process tube 203. This is the Boat UNLOAD step of FIG. 13.

Furthermore, in the PURGE Cleaning step includes a larger number of steps. For example, the PURGE Cleaning step can be realized by setting the cleaning processing conditions differently according to parts to be cleaned. The processing conditions in the part of the processing chamber 202 where the substrate processing is performed may be different from the processing conditions in the lower part of the process chamber 202 where the substrate processing is not performed. Moreover, in the case of cleaning the gas supply pipes 171, 172, 173, 174 and 232, the etching may be performed under processing conditions different from conditions of cleaning the walls of the process chamber 202. Like the walls of the process chamber 202, the cleaning conditions may be changed at the lower and upper parts of the inner tube 204 or the boat 217.

The case where the PURGE Cleaning step includes a plurality of steps will be exemplified. The PURGE Cleaning step 1 sets conditions of cleaning the lower part of the process chamber 202 where the substrate processing is not executed, the PURGE Cleaning step 2 sets conditions of cleaning the inner tube 204 or the boat 217, as well as the walls of the process chamber 202, and the PURGE Cleaning step 3 sets conditions of cleaning the gas supply pipes 171, 172, 173, 174 and 232. Furthermore, the PURGE Cleaning step may be executed separately at each gas supply pipe. Specifically, in each of the PURGE Cleaning step 1 to the PURGE Cleaning step 3, the settings of the flow rate of the cleaning gas, the pressure of the process chamber 202, or step times may be changed.

In addition, the substrate processing apparatus in accordance with the present invention can be applied to an apparatus for processing a glass substrate of an LCD device or the like as well as a semiconductor manufacturing apparatus. The substrate processing apparatus in accordance with the present invention should not be limited to a processing inside the furnace, and can be used to perform a film-forming process such as CVD, PVD, a process for forming an oxide film or a nitride film, and a process for forming a film including metal. Furthermore, the substrate processing apparatus in accordance with the present invention can be applied to an exposure apparatus, a lithography apparatus, a coating apparatus, a CVD apparatus using plasma, or the like.

According to a substrate processing apparatus in accordance with the present invention, by executing a recipe for maintaining a process chamber while a substrate as a processing target is not loaded in the substrate processing apparatus between production processes, the non-uniformity in the substrate qualities can be prevented, and the reliability can be obtained from the execution result of a recipe for processing a substrate.

(Supplementary Note)

The present invention also includes the following embodiments.

(Supplementary Note 1)

According to an embodiment of the present invention, there is provided a substrate processing apparatus, comprising: a control unit executing a first recipe for substrate processing, wherein after the substrate processing is completed through the execution of the first recipe, if a predetermined time is elapsed in a state that a next substrate to be processed is not carried into the process chamber, the control unit executes a second recipe for maintaining a process chamber where the substrate is processed.

(Supplementary Note 2)

In the substrate processing apparatus of Supplementary Note 1, the control unit performs a control to repeatedly execute the second recipe at each predetermined time.

(Supplementary Note 3)

In the substrate processing apparatus of Supplementary Note 1, the second recipe is a recipe for cleaning the inside of the process chamber.

(Supplementary Note 4)

In the substrate processing apparatus of Supplementary Note 1, a difference between the first recipe and the second recipe is determined according to a setting or not of an operation of a mechanism part which is not involved in a process.

(Supplementary Note 5)

In the substrate processing apparatus of Supplementary Note 1, a process gas flows inside the process chamber in the first recipe, and an inert gas flows inside the process chamber in the second recipe.

(Supplementary Note 6)

In the substrate processing apparatus of Supplementary Note 1, processing conditions of the first recipe and the second recipe are different in any one of a gas flow rate, a pressure, and a temperature.

(Supplementary Note 7)

According to another embodiment of the present invention, there is provided a method of manufacturing a semiconductor device in the substrate processing apparatus of any one of Supplementary Notes 1 to 6, wherein if start of a first recipe is instructed during execution of a second recipe for maintaining a process chamber where a substrate is processed, a next substrate is processed by executing the first recipe after the execution of the second recipe.

(Supplementary Note 8)

According to another embodiment of the present invention, there is provided a method of managing a semiconductor manufacturing apparatus, comprising: (a) executing a first recipe to process a substrate; and (b) executing a second recipe to prepare for the processing of the substrate, wherein in the operation (b), time elapsed from the completion of the operation (a) is measured until a next substrate processing is started, and the second recipe is controlled to be executed, based on the measured elapsed time, to maintain a process chamber where the substrate is processed.

(Supplementary Note 9)

In the method of Supplementary Note 8, in a case where start of the first recipe is instructed in order to process the next substrate processing, if the second recipe is being executed, the first recipe is controlled to be executed after completion of the second recipe.

What is claimed is:

1. A substrate processing apparatus, comprising:
   a boat including a plurality of holding members and configured to hold a plurality of substrates horizontally;
   a process chamber accommodating the boat when the plurality of substrates are processed; and
   a control unit configured to execute a first recipe for processing the plurality of substrates and a second recipe for a maintenance of the process chamber,
   wherein the control unit is configured to:
   (a) execute the first recipe;
   (b) start a watch timer when the plurality of substrates are completely processed by completing execution the first recipe;
   (c) execute the second recipe without any substrates loaded in the boat when a predetermined time elapses after starting the watch timer;
   (d) restart the watch timer when the second recipe is completed; and
   (e) repeatedly perform steps (c) and (d) until an instruction to process next substrates to be processed is received,
   wherein the control unit is configured to start processing the next substrates to be processed according to the instruction by executing the first recipe after execution of the second recipe is complete without restarting the watch timer when the instruction is received during the execution of the second recipe, and
   wherein the control unit is configured to start processing the next substrates to be processed according to the instruction by executing the first recipe when the instruction is received after the execution of the second recipe is complete.

2. The substrate processing apparatus of claim 1, wherein the second recipe is a recipe for cleaning an inside of the process chamber.

3. The substrate processing apparatus of claim 2, wherein the second recipe is for removing layers deposited inside the process chamber.

4. The substrate processing apparatus of claim 1, wherein a process gas is supplied into the process chamber during the execution of the first recipe, and an inert gas is supplied into the process chamber during the execution of the second recipe.

5. The substrate processing apparatus of claim 1, wherein processing conditions of the first recipe and the second recipe are different in any one of a gas flow rate, a pressure, and a temperature.

6. A method of manufacturing a semiconductor device in the substrate processing apparatus of claim 1, wherein if start of a first recipe is instructed during execution of a second recipe for maintaining a process chamber where a substrate is processed, a next substrate is processed by executing the first recipe after the execution of the second recipe.

7. The substrate processing apparatus of claim 1, wherein step (c) is repeatedly performed in step (e) with a predetermined interval therebetween while a state of the substrate processing apparatus is in other than a RUN state.

8. The substrate processing apparatus of claim 1, further comprising:
   a setup screen for configuring flow rates, temperatures and pressures of a cleaning gas and an inert gas used during the execution of the second recipe.

9. The substrate processing apparatus of claim 8, wherein cleaning processing conditions of the second recipe differ according to locations to be cleaned.

10. The substrate processing apparatus of claim 1, wherein the second recipe comprises a plurality of steps.

11. The substrate processing apparatus of claim 10, wherein cleaning processing conditions of the second recipe differ according to locations to be cleaned.

12. The substrate processing apparatus of claim 11, wherein a cleaning processing condition for cleaning a region of the processing chamber where the plurality of substrates is processed differs from a cleaning processing condition for cleaning a region of the processing chamber other than the region of the processing chamber where the plurality of substrates is processed.

13. The substrate processing apparatus of claim 11, further comprising:
   a gas supply pipe,
   wherein a cleaning processing condition for cleaning the gas supply pipe differ from a cleaning processing condition for cleaning a wall of the process chamber.

14. The substrate processing apparatus of claim 10, further comprising:

a gas supply pipe, wherein a cleaning processing condition for cleaning the gas supply pipe is set for each of the plurality of steps of the second recipe.

15. A substrate processing apparatus, comprising:

a boat including a plurality of holding members and configured to hold a plurality of substrates horizontally;

a process chamber accommodating the boat when the plurality of substrates are processed;

a control unit configured to execute a first recipe for processing the plurality of substrates and a second recipe for a maintenance of the process chamber, wherein the control unit is configured to:

(a) execute the first recipe;

(b) start a watch timer when the plurality of substrates are completely processed by completing execution of the first recipe;

(c) execute the second recipe without the boat loaded in the process chamber when a predetermined time elapses after starting the watch timer;

(d) restart the watch timer operation when the second recipe is complete; and (e) repeatedly perform steps (c) and (d) until an instruction to process next substrates to be processed is received, wherein the control unit is configured to start processing the next substrates to be processed according to the instruction by executing the first recipe after execution of the second recipe is complete without restarting the watch timer when the instruction is received during the execution of the second recipe, and wherein the control unit is configured to start processing the next substrates to be processed according to the instruction by executing the first recipe when the instruction is received after the execution of the second recipe is complete.

* * * * *